(12) United States Patent
Hartley et al.

(10) Patent No.: US 9,177,817 B2
(45) Date of Patent: Nov. 3, 2015

(54) METHODS FOR FABRICATING THREE-DIMENSIONAL NANO-SCALE STRUCTURES AND DEVICES

(75) Inventors: John G. Hartley, Clifton Park, NY (US); Ravi K. Bonam, Albany, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 0 days.

(21) Appl. No.: 14/238,547

(22) PCT Filed: Aug. 21, 2012

(86) PCT No.: PCT/US2012/051650
§ 371 (c)(1),
(2), (4) Date: Feb. 12, 2014

(87) PCT Pub. No.: WO2013/028650
PCT Pub. Date: Feb. 28, 2013

(65) Prior Publication Data
US 2014/0191375 A1    Jul. 10, 2014

Related U.S. Application Data

(60) Provisional application No. 61/526,588, filed on Aug. 23, 2011.

(51) Int. Cl.
*H01L 21/027* (2006.01)
*H01L 21/308* (2006.01)
(Continued)

(52) U.S. Cl.
CPC .......... *H01L 21/308* (2013.01); *B81C 1/00031* (2013.01); *G03F 7/0048* (2013.01); *G03F 7/038* (2013.01); *G03F 7/039* (2013.01); *G03F 7/0755* (2013.01); *G03F 7/095* (2013.01); *G03F 7/2059* (2013.01); *G03F 7/325* (2013.01); *G03F 7/38* (2013.01); *G03F 7/70416* (2013.01); *H01L 29/02* (2013.01); *B81C 2201/0157* (2013.01); *H01L 21/0277* (2013.01)

(58) Field of Classification Search
CPC .................................................. H01L 21/0277
USPC .................................. 430/312; 438/725, 763
See application file for complete search history.

(56) References Cited

U.S. PATENT DOCUMENTS

| 5,468,595 A | * | 11/1995 | Livesay | 430/296 |
| 5,766,967 A | * | 6/1998 | Lai et al. | 438/167 |

(Continued)

FOREIGN PATENT DOCUMENTS

| JP | 2008299165 A | * | 12/2008 |
| WO | 2005054119 A2 | | 6/2005 |

OTHER PUBLICATIONS

International Search Report for PCT/US2012/051650 dated Feb. 15, 2013.

*Primary Examiner* — George Fourson, III
(74) *Attorney, Agent, or Firm* — Heslin Rothenberg Farley & Mesiti P.C.

(57) ABSTRACT

A method of fabricating a 3 dimensional structure, includes: forming a stack of at least 2 layers of photo resist material having different photo resist sensitivities upon a substrate; exposing the stack to beams of electromagnetic radiation or charged particles of different dosages to achieve selective solubility along a height of the stack; and dissolving soluble portions of the stack with a solvent to produce a 3 dimensional structure of desired geometry.

38 Claims, 22 Drawing Sheets

(51) Int. Cl.
- *G03F 7/004* (2006.01)
- *G03F 7/038* (2006.01)
- *G03F 7/039* (2006.01)
- *G03F 7/075* (2006.01)
- *G03F 7/095* (2006.01)
- *G03F 7/20* (2006.01)
- *G03F 7/32* (2006.01)
- *G03F 7/38* (2006.01)
- *B81C 1/00* (2006.01)
- *H01L 29/02* (2006.01)

(56) References Cited

U.S. PATENT DOCUMENTS

| | | | |
|---|---|---|---|
| 6,287,476 B1* | 9/2001 | Ju et al. | 216/47 |
| 6,555,479 B1* | 4/2003 | Hause et al. | 438/706 |
| 6,749,997 B2 | 6/2004 | Morales et al. | |
| 2006/0257583 A1* | 11/2006 | Kaule | 427/551 |
| 2007/0184643 A1* | 8/2007 | Rinne | 438/612 |
| 2010/0003623 A1* | 1/2010 | Liu | 430/326 |
| 2010/0028809 A1 | 2/2010 | Vanleenhove et al. | |
| 2010/0047722 A1 | 2/2010 | Shim | |
| 2011/0204523 A1* | 8/2011 | Arnold et al. | 257/773 |
| 2014/0167253 A1* | 6/2014 | Tseng et al. | 257/737 |

\* cited by examiner

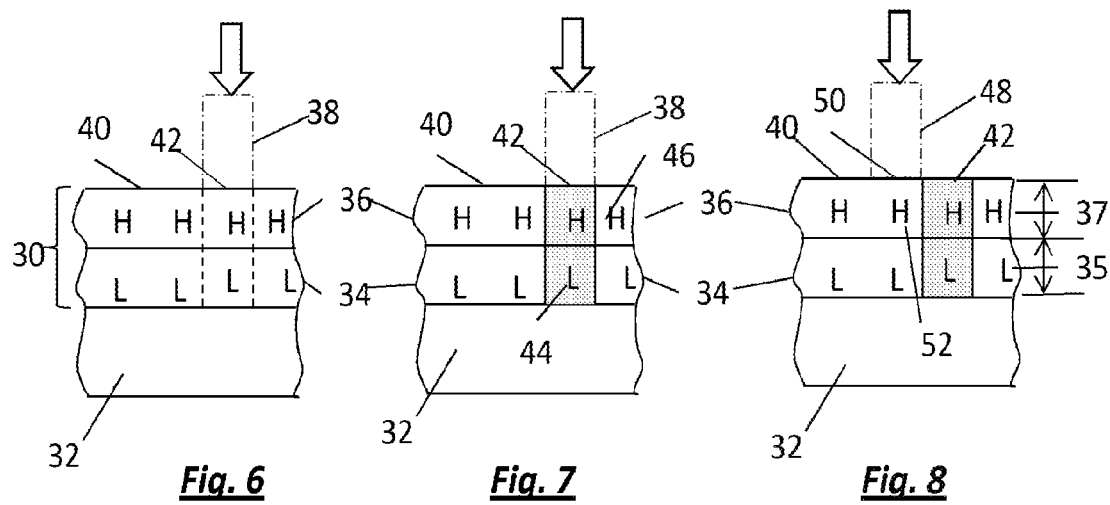
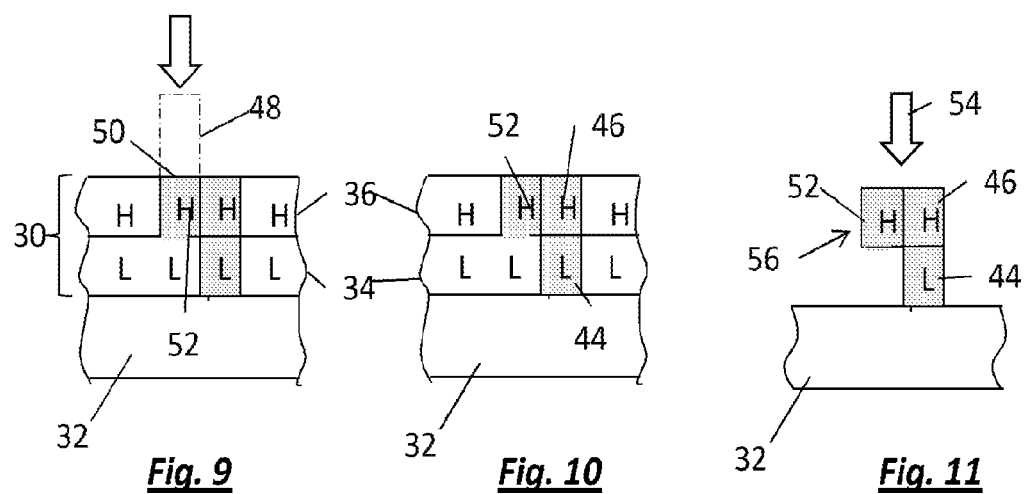

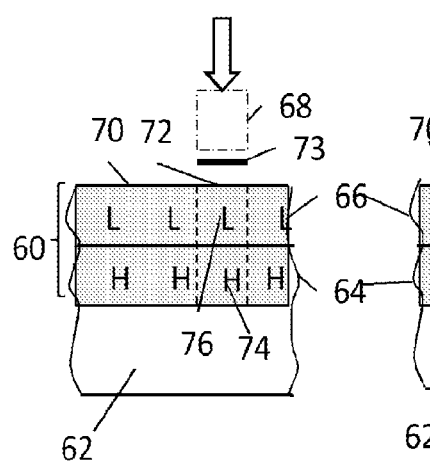
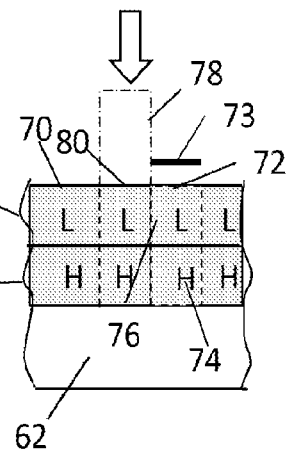
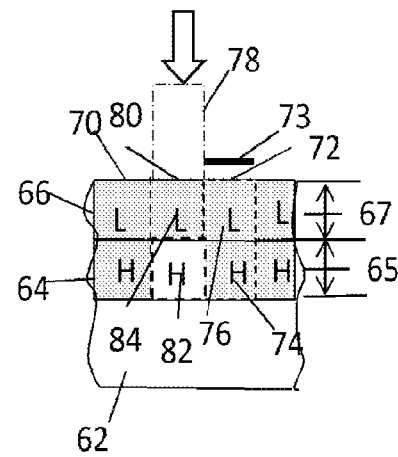
Fig. 12    Fig. 13    Fig. 14
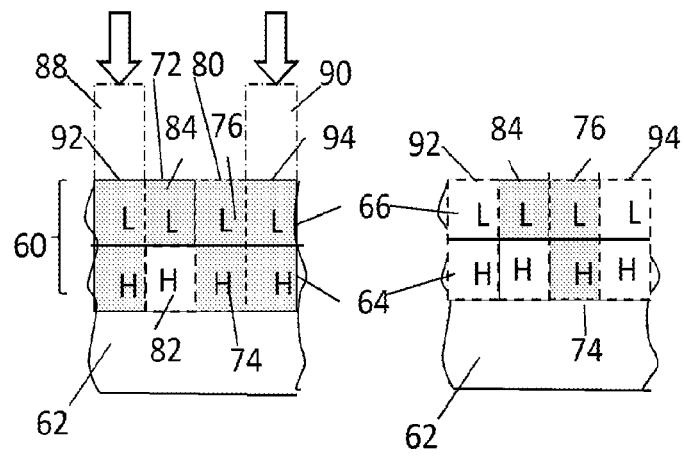
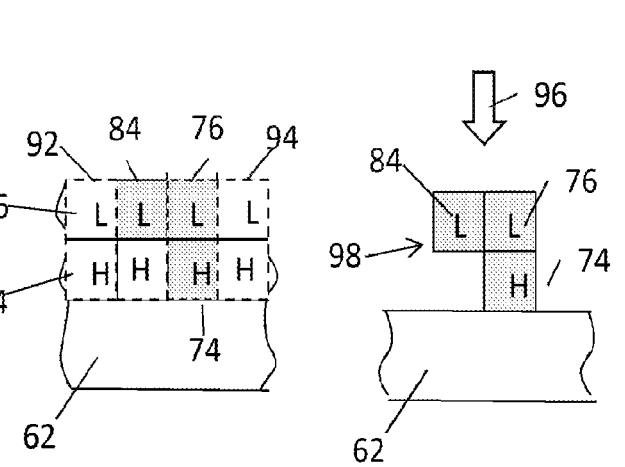
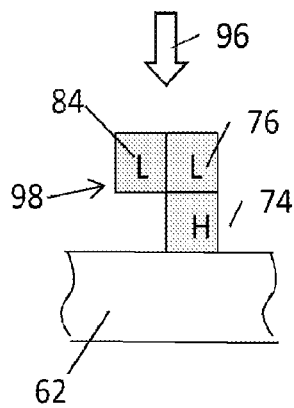
Fig. 15    Fig. 16    Fig. 17

Tapered tree structure model

| Resist Layer | Name | Thickness (nm) |
|---|---|---|
| 13 | HSQ | 160.00 nm |
| 12 | NEB-31 | 60.00 nm |
| 11 | HSQ | 160.00 nm |
| 10 | NEB-31 | 60.00 nm |
| 9 | HSQ | 160.00 nm |
| 8 | NEB-31 | 60.00 nm |
| 7 | HSQ | 160.00 nm |
| 6 | NEB-31 | 60.00 nm |
| 5 | HSQ | 160.00 nm |
| 4 | NEB-31 | 60.00 nm |
| 3 | HSQ | 160.00 nm |
| 2 | NEB-31 | 60.00 nm |
| 1 | HSQ | 160.00 nm |
| Substrate | Substrate | Substrate |

174 →

Resist Stack

*Fig. 22*

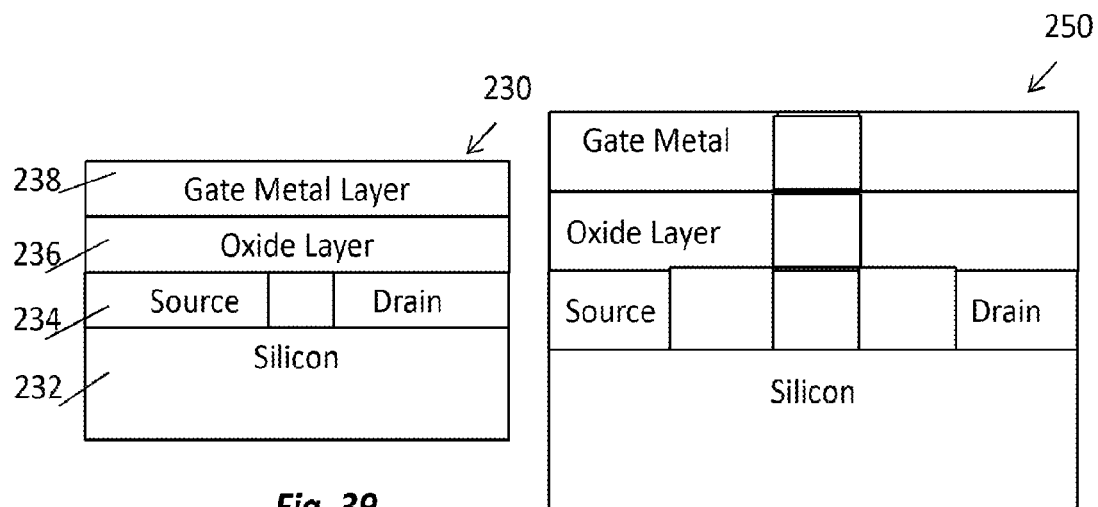
Fig. 39
Fig. 41
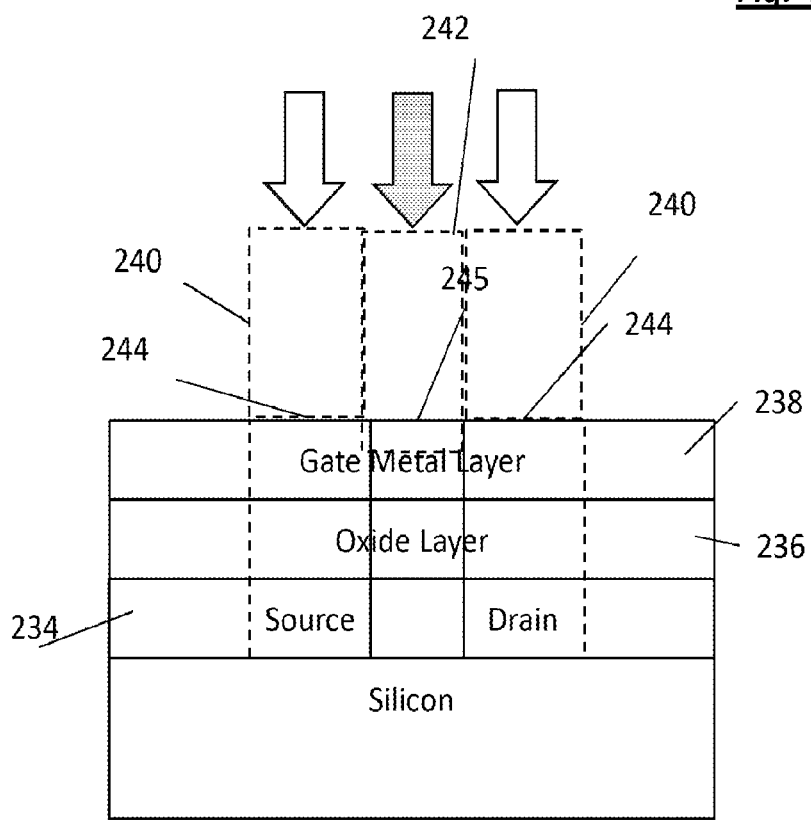
Fig. 40

METHODS FOR FABRICATING THREE-DIMENSIONAL NANO-SCALE STRUCTURES AND DEVICES

CROSS REFERENCE TO RELATED APPLICATIONS

This application is a national stage filing under section 371 of International Application No. PCT/US2012/051650 filed on Aug. 21, 2012, and published in English on Feb. 28, 2013 as WO 2013/028650 A2 and claims priority of U.S. provisional application No. 61/526,588 filed on Aug. 23, 2011, the entire disclosure of these applications being hereby incorporated herein by reference.

BACKGROUND OF THE INVENTION

1. Field of the Invention

The present invention relates, generally, to methods of forming minute structures, for example, nano- or micro-scale structures, and the structures so formed. In particular, aspects of the invention include methods of forming minute structures by selectively exposing photo resists of varying sensitivity to varying dosages of radiation, and the structures so formed.

2. Description of Related Art

The fabrication of microscopic structures, for example, in the nanometer or micrometer size range has attracted increased attention. The fabrication of such structures may typically take the form of "top down" methods, for example, lithographic methods, or "bottom up" methods, for example, colloidal or DNA-type self-assembly. Regardless of the method of assembly, prior art methods of assembly have been limited in their success, for example, prior art methods provided limited fabrication flexibility and were generally not scalable.

One area showing increased promise is the top down method of forming structures employing lithographic methods, for example, employing photo resist materials.

As known in the art, photo resists typically comprise a solution of a liquid solvent and polymer solute. The polymer solute typically comprises polymer chains that are sensitive to radiation, for example, to electromagnetic radiation or electron beam radiation or any type of particle beam radiation. Typically, the polymer solute chains will either combine or "cross link" when exposed to radiation, for example, forming longer, less soluble polymer chains, or cleave or "scission" when exposed to radiation, for example, resulting in shorter, more soluble polymer chains. After reaction with radiation, the liquid solute can be dissolved in an appropriate solvent, for example, an alcohol, removing the scissioned polymer chains or leaving the cross-linked polymer chains to form thin films of polymer on, for example, substrates.

As also known in the art, photo resists are typically available in two "tones": a "positive-tone" and a "negative-tone." Positive-tone photo resists comprise solvents having solutes comprising polymer chains that when exposed to certain types of radiation scission and can be dissolved when exposed to an appropriate solvent. In contrast, negative-tone photo resists comprise solvents having solutes comprising polymer chains that when exposed to certain types of radiation cross-link and are not dissolved when exposed to an appropriate solvent.

Both positive-tone and negative-tone photo resists are affected by radiation at varying levels, or dosages, of exposure to the radiation. The polymer solute in a positive-tone photo resist will begin to scission at or about a specific dosage and the polymer solute in a negative-tone photo resist will cross link at or about a specific dosage. These threshold dosages, where reaction of the polymer chains initiates, are referred to as the "base dose" or the "sensitivity" of the photo resist. As known in the art, these base dosages or sensitivities are defined in terms of the unit micro Coulombs per square centimeter ($\mu C/cm^2$). The dosage provided by radiation or charged particle source, for example, an E-beam writer, typically delivers a dose of radiation or charged particles per unit area per second (for example, $Amps/cm^2$=coulombs/sec/$cm^2$=coulombs/$cm^2$/sec). Therefore, to provide the desired photo resist dosage, the source at the given rate of delivery is provided over a time period (for example, seconds) to provide the desired dose of $\mu C/cm^2$ to the photo resist (that is, rate×time=$\mu C/cm^2$/sec×sec=charge in $\mu C/cm^2$).

The sensitivity of photo resists may vary from single digit $\mu C/cm^2$, a very high sensitivity, to about 10,000 $\mu C/cm^2$, a very low sensitivity. However, the typical range of sensitivity of photo resists is from about 100 $\mu C/cm^2$/ to about 1000 $\mu C/cm^2$. For example, the negative-tone photo resist hydrogen silsesquioxane (HSQ) has a sensitivity of about 500 $\mu C/cm^2$ (for example, a lower sensitivity) while the negative-tone photo resist polyvinyl phenol (for example, NEB-31) has a sensitivity of about 30 $\mu C/cm^2$ (for example, a higher sensitivity). Also, the positive-tone photo resist methyl methacrylate-methacrylic acid (MA-MAA) copolymer has a sensitivity of about 175 $\mu C/cm^2$ (for example, a higher sensitivity), while the positive-tone photo resist poly(methyl methacrylate) (PMMA) has a sensitivity at about 650 $\mu C/cm^2$ (for example, a lower sensitivity). These sensitivities are based on an electron beam energy of 100 kV. Different beam energies or charged particles will exhibit different sensitivities.

Aspects of the present invention provide methods of producing structures, for example, nano- or micro-scale structures, by tailoring the assembly of layers of photo resist of varying sensitivity and exposing the layers to dosages of radiation or charge particles to selectively cross-link or scission portions of the layers of photo resist in the photo resist stack and then developing the photo resist stack with an appropriate solvent to form three-dimensional complex structures.

SUMMARY OF ASPECTS OF THE INVENTION

The present invention comprises methods for fabricating three-dimensional (3D) structures, for example, complex 3D structures, from photo resist material and the structures so fabricated. Aspects of the invention employ lithographic methods, for example, conventional lithographic methods, to fabricate layered structures from photo resist materials, specifically, from photo resist materials having varying photo resist sensitivity. The photo resist materials may be positive-tone or negative-tone photo resist materials, or a combination thereof. The methods can be implemented with beams of electromagnetic radiation, for example, optical beams, or beams of charged particles, such as, electrons.

In one aspect, the photo resist materials may comprise different sensitivities. The photo resist layers of different sensitivities may be layered, for example, vertically layered, in a resist stack, for instance, by spin coating. Providing layers of varying sensitivity permits and varying the beam dosage allows for the formation of structures of varying geometry, where portions of layers lower in the resist stack can be made soluble in a solvent while leaving portions of upper layers in the stack insoluble to a solvent.

One embodiment of the present invention is a method for producing structures, the method comprising or including the steps of: depositing a plurality of layers of photo resist, for example, negative-tone photo resist, onto a substrate, the plurality of layers having an upper surface and at least one layer having a higher photo resist sensitivity than the photo resist sensitivity of at least one other layer of the plurality of layers; exposing a first area of the upper surface to a first beam of one of electromagnetic radiation and charged particles wherein a portion of each of the plurality of layers beneath the first area of the upper surface becomes substantially insoluble when contacted with a predetermined solvent; exposing a second area of the upper surface, contiguous with the first area, to a second beam of one of electromagnetic radiation and charged particles wherein a portion of the at least one layer having a higher photo resist sensitivity beneath the second area becomes substantially insoluble when contacted with the predetermined solvent; and contacting the plurality of layers with the predetermined solvent, for example, an alcohol or an acetone, to dissolve the soluble portions to provide the nano-scale structure. In one aspect, the plurality of layers of photo resist may be at least three layers of photo resist. In another aspect, the at least one layer having the higher photo resist sensitivity comprises at least two layers having the higher photo resist sensitivity. According to another aspect, the method further comprises exposing at least a third area of the upper surface, contiguous with the second area, to a third beam of one of electromagnetic radiation and charged particles capable of making a portion of the at least one layer having a higher photo resist sensitivity beneath the third area substantially insoluble when contacted with the predetermined solvent. In another aspect, an energy of the first beam is different from an energy of the second beam. In a further aspect, the plurality of layers comprises a plurality of photo resist sensitivities.

Another embodiment of the invention is a method for producing structures, the method comprising or including the steps of: depositing a plurality of layers of photo resist, for example, positive-tone photo resist, onto a substrate, the plurality of layers having an upper surface and at least one layer having a higher photo resist sensitivity than the photo resist sensitivity of at least one other layer of the plurality of layers; preventing exposure of a first area of the upper surface to any beam of electromagnetic or charged particles to ensure that a portion of each of the plurality of layers beneath the first area of the upper surface is substantially insoluble when contacted with a predetermined solvent; exposing a second area of the upper surface, contiguous with the first area, to a first beam of one of electromagnetic radiation and charged particles wherein a portion of the at least one layer having a higher photo resist sensitivity beneath the second area becomes substantially soluble when contacted with the predetermined solvent; exposing at least one third area of the upper surface, contiguous with at least one of the first area and the second area, to a second beam of one of electromagnetic radiation and charged particles wherein a portion of each of the plurality of layers beneath the at least one third area becomes substantially soluble when contacted with the predetermined solvent; and contacting the plurality of layers with the predetermined solvent, such as, an alcohol or an acetone, to dissolve the soluble portions to provide the structure. In one aspect, the plurality of layers of photo resist may be at least three layers of photo resist. In another aspect, the at least one layer having the higher photo resist sensitivity comprises at least two layers having the higher photo resist sensitivity. In another aspect, the method further comprises exposing at least a third area of the upper surface, contiguous with the second area, to a second beam of one of electromagnetic radiation and charged particles capable of making a portion of the at least one layer having a higher photo resist sensitivity beneath the third area substantially soluble when contacted with the predetermined solvent. According to another aspect, each the plurality of layers may comprise a photo resist sensitivity as a function of a beam energy to which each layer is exposed, for example, the photo resist sensitivities may vary through a depth of the plurality of layers.

A further embodiment of the invention is a structure fabricated from any one of the methods recited above, for example, a micro-scale structure, a nano-scale structure, and a sub-nano-scale structure.

Another embodiment of the invention is a structure fabricated from photo resist, the structure comprising or including at least one support member; and a plurality of projections mounted to the at least one support and directed substantially perpendicular to an axis of the support member. In one aspect, the plurality of projections may comprise at least two sets of opposing projections. In another aspect, the structure may comprise one of a micro-scale structure, a nano-scale structure, and a sub-nano-scale structure. The photo resist from which the structure is made may be a positive-tone photo resist, a negative-tone photo resist, or combination thereof.

Details of these aspects of the invention, as well as further aspects of the invention, will become more readily apparent upon review of the following drawings and the accompanying claims.

BRIEF DESCRIPTION OF THE FIGURES

The subject matter that is regarded as the invention is particularly pointed out and distinctly claimed in the claims at the conclusion of the specification. The foregoing and other objects, features, and advantages of the invention will be readily understood from the following detailed description of aspects of the invention taken in conjunction with the accompanying drawings in which:

FIGS. 6 through 11 are a series of schematic illustrations of the treatment of the photo resist stack according to one aspect of the invention.

FIGS. 12 through 17 are a series of schematic illustrations of the treatment of the photo resist stack according to another aspect of the invention.

FIG. 22 is a table identifying the photo resist and layer thicknesses for the photo resist stack shown in FIG. 21.

FIGS. 39-41 are schematic views of a process for fabricating electronic components according to aspects of the invention.

DETAILED DESCRIPTION OF FIGURES

Figure 1:
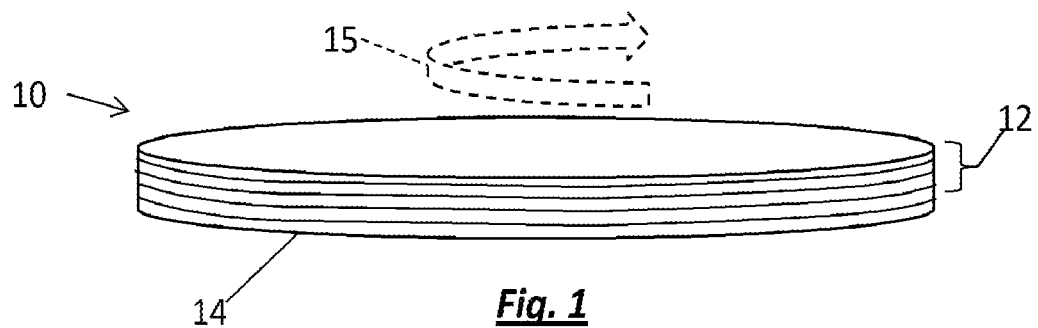
FIG. 1 is a perspective view of an assembly of a plurality of layers of photo resist mounted on a substrate according to one aspect of the invention.

The details and scope of the aspects of the present invention can best be understood upon review of the attached figures and their following descriptions. FIG. 1 is a perspective view of an assembly 10 of a plurality of layers 12 of photo resist deposited or mounted on a substrate 14 according to one aspect of the invention. The plurality of layers, or "photo resist stack," 12, for example, 2 or more layers or 10 or more layers, may comprise a photo resists of "positive tone" or "negative tone." Substrate 14 may be any substrate comprising any material adapted to support photo resist stack 12, for example, a substrate having a thickness in the range of about 1 micrometer [μm] to about 500 millimeters [mm], but may typically be a silicon-based substrate. Other materials that substrate 14 may be made of include, but are not limited to, gallium-arsenide, germanium, indium-phosphide, and their equivalent. The photo resist stack 12 may be deposited on substrate 14 by conventional means, for example, conventional photolithographic means, for instance, by spin coating, as suggested by phantom arrow 15. The spin coating may typically comprise a series of "coat" and "bake" processes as known in the art.

According to aspects of the invention, a "photo resist" may comprise any material that responds to an influx of energy by either photon, electron, charged particle, and/or ion transport by altering the chemical solubility properties of the material. These materials may be referred to by the expressions "193 resist," "EUV resist," "electron beam resist," and simply "resist," among others. The expression "photo resist" as used herein comprises these and other related materials.

Figures 3, 4, 5:
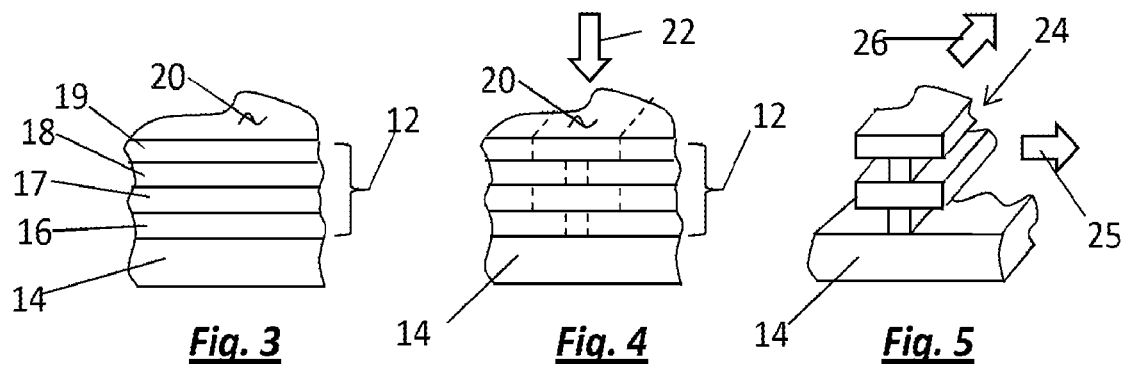
FIG. 3 is a detailed view of a cross section of the assembly shown in FIG. 2 identified by detail 3 in FIG. 2.
FIG. 4 is a detailed view, similar to FIG. 3, of the treatment of stack 12 with radiation or charged particles according to aspects of the invention.
FIG. 5 is a detailed view, similar to FIGS. 3 and 4, of typical structure that results after exposure to a solvent according to aspects of the invention.

According to aspects of the invention, the photo resist stack 12 is provided with layers of photo resist of varying sensitivity, for example, of varying μC/cm² and is selectively treated with electromagnetic radiation and/or charged particles to selectively treat portions of the layers in the photo resist stack 12 to produce structures, for example, three-dimensional micro- or nano-, or sub-nano-scale structures, for example, as shown in FIG. 5, when exposed or developed by appropriate solvents. Aspects of the invention can provide a broad range of surface effects and/or structures that can be used in a broad range of micro- and/or nano- and/or sub-nano-scale applications, for example, nano-electro-mechanical systems (NEMS); micro-electro-mechanical systems (MEMS); micro-, nano-, and/or sub-nano-scale electronics; micro-, nano-, and/or sub-nano-scale medicine; micro-, nano-, and/or sub-nano-scale sensors; micro-, nano-, and/or sub-nano-scale optical or photonic devices; or in any field where such small scale structures can be used.

Figure 2:
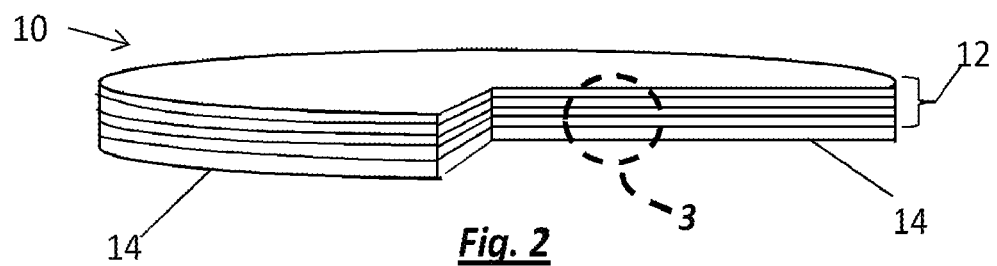
FIG. 2 is a perspective view, partially sectioned, of the assembly shown in FIG. 1 displaying an internal view of the assembly.

FIG. 2 is a perspective view, partially sectioned, of the assembly 10 shown in FIG. 1 displaying an internal view of assembly 10. FIG. 3 is a detailed view of a cross section of the assembly 10 shown in FIG. 2 identified by detail 3 in FIG. 2. As shown in FIG. 3, the photo resist stack 12 may comprise layers 16, 17, 18, and 19 mounted on substrate 14 wherein the top layer 19 provides an upper or exposed surface 20 of photo resist stack 12.

FIG. 4 is a detailed view, similar to FIG. 3, of the treatment of stack 12 with radiation or charged particles, as indicated by arrow 22, according to aspects of the invention. The treatment by radiation and/or particles 22 is selectively chosen with respect to location and dosage to produce a desired structure to cross-link and/or scission the polymers in the layers of photo resist in stack 12. FIG. 5 is a detailed view, similar to FIGS. 3 and 4, of a typical structure 24 that may be provided after exposure to a solvent, for example, a predetermined solvent, such as, an alcohol (such as, isopropyl alcohol (IPA)), an acetone, or a ketone (such as, methyl isobutyl ketone (MIBK)), according to aspects of the invention. The size and shape of structure 24 shown in FIG. 5 represents one of many structures that may be produced according to aspects of the invention. As will be appreciated by those of skill in the art, structure 24 may typically be one of a plurality of structures 24, for example, having a substantially identical cross-section shape, that may be provided with lithographic methods according to aspects of the invention. For example, thousands, tens of thousands, or millions of structures 24 may be fabricated on a single substrate 14 according to aspects of the invention. The structures 24 may be provided at a regular frequency or "pitch," for example, in a direction substantially parallel to the cross-sectional shape of structures 24, as indicated by arrow 25 in FIG. 5. As is known in the art, structure 24 may typically comprise a substantially uniform cross sectional shape, such as, the "tree shape" shown in FIG. 5, and extend in a direction across the width or diameter of the substrate 14, for example, substantially completely across the width or diameter of substrate 14, in the direction indicated by arrow 26.

FIGS. 6 through 11 are a series of schematic illustrations of the treatment of the photo resist stack 30, similar to photo resist stack 12, deposited or mounted on substrate 32, for example, by spin coating, according to one aspect of the invention. In the aspects shown in FIGS. 6-11, the photo resists that comprise the layers in photo resist stack 30 are photo resists of "negative-tone," that is, photo resists that become insoluble to certain solvents after exposure to electromagnetic radiation and/or charged particles. Examples of such "negative-tone" resists that may be used include, but are not limited to, hydrogen silsesquioxane (HSQ) or polyvinyl phenol (for example, NEB-31), or their equivalents. In addition, according to aspects of the invention, the negative-tone photo resists in stack 30 comprise photo resists of varying "sensitivity," as discussed above. An aspect of the invention for "positive-tone" photo resists is illustrated and described with respect to FIGS. 12-17

As shown in FIG. 6, in this illustrative example of one aspect of the invention, stack 30 include two layers 34 and 36 deposited or mounted on substrate 32, for example, by spin coating. In order to facilitate illustration and discussion of aspects of the invention, the schematic illustrations of the invention shown in FIGS. 6-11, as well the illustrations in FIGS. 12-17 and 18-2, among others, are schematic illustrations of typical cross sectional views of the photo resist stacks and structures that can be provided according to aspects of the invention. For example, these schematics are similar to the cross section of the three dimensional structure 24 shown in FIG. 5.

Layer 34 of stack 30 has a thickness 35 and layer 36 has a thickness 37; see FIG. 8. Thicknesses 35 and 37 may vary from about 10 nm to about 500 nm. According to aspects of the invention, photo resist layers 34 and 36 have varying photo resist sensitivity, for example, as shown in FIG. 6, layer 34 comprises a relatively lower (L) sensitivity than layer 36, which has a relatively higher (H) sensitivity than layer 34 in this negative tone aspect of the invention. According to aspects of the invention, a negative-tone photo resist with a relatively higher sensitivity becomes insoluble in a predetermined solvent at a lower radiation and/or charged particle dosage than a negative-tone photo resist having a relatively lower sensitivity. For example, in one aspect, the lower (L) sensitivity of layer 34 may have a sensitivity of about 400 $\mu C/cm^2$ to about 1000 $\mu C/cm^2$ and the higher (H) layer 36 may have a sensitivity of about 10 $\mu C/cm^2$ to about 300 $\mu C/cm^2$. In one aspect, the higher sensitivity photo resist comprises a sensitivity of about 0.10 to about 0.5 of the lower photo resist sensitivity; for example, between about 0.25 to about 0.35 of the lower photo resist sensitivity, such as, about 0.3 of the lower sensitivity. Accordingly, in the aspect of the invention shown in FIG. 6, the photo resist of layer 36, having a higher sensitivity, will become insoluble to the solvent at a lower radiation and/or charged particle dose. In contrast, the photo resist of layer 34 will not become insoluble to the solvent when exposed to a dosage that makes layer 36 insoluble. The implications of this difference photo resist sensitivity will become apparent in the following discussion.

FIG. 7 schematically illustrates the exposure of the stack 30 to beam 38 of electromagnetic radiation, for example, ultraviolet (UV) light, deep ultraviolet (DUV) light or extreme ultraviolet (EUV) light, or charged particles, such as, a beam of electrons (E-beam). In the following discussion, beam 38 and similar beams will be referred to as a "beam" or "beams," though, according to aspects of the invention, these beams are understood to mean beams of electromagnetic radiation and/or beams of charged particles which may be applied simultaneously or sequentially, and may comprise separate beams or the same beam applied to different locations at the same time or at different times. According to aspects of the invention, the stack 30 includes a surface 40, for example, an exposed or upper surface, and beam 38 illuminates or exposes an area 42, for example, a predetermined area (for example, a first area) on surface 40, penetrates surface 40 and exposes at least a portion 44, 46 of each of the plurality of layers 34, 36 beneath the area 42. Area 42 may comprise a circular or polygonal shaped area. Area 42 may have an aspect ratio ranging from 1:1, to 10:1, to 100:1 or higher. Though shown as a simple closed area in FIGS. 6-11, area 42 may be an open area, for example, an open rectangular or open circular area, where area 42 shown is only one part, for example, an axi-symmetric part, of the open area. The portion 44 of layer 34 and portion 46 of layer 36 accordingly become substantially insoluble when contacted with a predetermined solvent. For example, beam 38 is of sufficient strength or dosage that the polymers in both portions 44 and 46, shown shaded in FIG. 7, are cross linked and become insoluble in the predetermined solvent.

FIG. 8 schematically illustrates the exposure of the stack 30 to beam 48 (for example, a second beam). According to aspects of the invention, beam 48 illuminates or exposes an area 50, for example, a predetermined area (for example, a second area) on surface 40 of stack 30, contiguous with area 42. Area 50 may have an aspect ratio ranging from 1:1, to 10:1, to 100:1 or higher. Area 50 may comprise a circular or polygonal shaped area. Though shown as a simple closed area in FIGS. 6-11, area 50 may be an open area, for example, an open rectangular or open circular area, where area 50 shown is only one part, for example, an axi-symmetric part, of the open area. Beam 48 penetrates surface 40 in area 50 and exposes at least a portion 52 of layer 36, that is, the layer having a higher (H) photo resist sensitivity, beneath the area 50 whereby portion 52 becomes substantially insoluble when contacted with the predetermined solvent. For example, beam 48 is of sufficient strength or dosage that the polymers in higher (H) sensitivity layer 36, shown shaded in FIG. 9, are cross-linked and become insoluble in the predetermined solvent, but beam 48 is not of sufficient dosage to cross-link the polymers in lower (L) sensitivity layer 34, which remains soluble in the predetermined solvent. The resulting treated stack 30 is shown in FIG. 10 with the appropriately shaded portions 44, 46, and 52 which, according to this aspect of the invention, are now insoluble in the predetermined solvent.

According to one aspect of the invention, the energy of the first beam and the second beam are generally about the same; however the quantity of energy delivered, or the instantaneous power delivered by the first beam and the second beam (or a third beam) may vary. For example, the quantity of energy or the instantaneous power delivered to a portion of a photo resist may be varied by varying the flux (current) of the beam or by varying the amount of dwell time (or time of exposure) of the beam, or both. In one aspect, by maintaining the energy of the beam (for example, 100 kV) relatively constant, the energy delivered to the photo resist can be varied by changing the exposure time of the beam on the photo resist. Accordingly, in one aspect, the power delivered by the second beam may be different from the power delivered by the first beam.

FIG. 11 schematically illustrates the development of stack 30, that is, the contacting of stack 30 with a solvent, indicated by arrow 54, such as, an alcohol or acetone, to dissolve or remove portions of photo resist layers not cross-linked by beams 38 and 48. Accordingly, the resulting structure 56 is provided comprising the treated portions 44, 46, and 52. Again, as noted previously, structure 56 may comprise one of many similar structures that may be provided on a single substrate 32 according to aspects of the invention, and FIG. 11 only represents a cross section of structure having a depth that may extend across substrate 32, for example, into the page of FIGS. 6-11.

FIGS. 12 through 17 are a series of schematic illustrations of the treatment of the photo resist stack 60 according to another aspect of the invention, in this case for a photo resist stack 60 of "positive-tone." Similar to the embodiment shown in FIG. 6 through 11, photo resist stack 60, similar to photo resist stack 12 or stack 30, is deposited or mounted on substrate 62, for example, by spin coating. In the aspects shown in FIGS. 12-17, the photo resists that comprise the layers in photo resist stack 60 are photo resists of "positive-tone," that is, photo resists that become soluble to certain solvents after exposure to radiation and/or charged particles. Examples of such "positive tone" resists that may be used include, but are not limited to, methyl methacrylate-methacrylic acid (MA-MAA) copolymer or poly(methyl methacrylate) (PMMA), or their equivalents. In addition, according to aspects of the invention, the positive-tone photo resists in stack 60 comprise photo resists of varying "sensitivity," as discussed above. An aspect of the invention for "negative-tone" photo resists is illustrated and described with respect to FIGS. 6-11

As shown in FIG. 12, in this illustrative example of one aspect of the invention, stack 60 include two layers 64 and 66 deposited or mounted on substrate 62, for example, by spin coating. Layer 64 of stack 60 has a thickness 65 and layer 66 has a thickness 67, see FIG. 14. Thicknesses 65 and 67 may vary from about 10 nm to about 500 nm. According to aspects of the invention, photo resist layers 64 and 66 have varying photo resist sensitivity, for example, as shown in FIG. 12, layer 64 comprises a relatively higher (H) sensitivity than layer 66, which has a relatively lower (L) sensitivity than layer 64 in this positive tone aspect of the invention. For example, in one aspect, the lower (L) sensitivity of layer 66 may have a sensitivity of about 400 $\mu C/cm^2$ to about 1000 $\mu C/cm^2$ and the higher (H) layer 64 may have a sensitivity of about 10 $\mu C/cm^2$ to about 300 $\mu C/cm^2$. In one aspect, the higher sensitivity photo resist comprises a sensitivity of about 0.10 to about 0.5 of the lower photo resist sensitivity; for example, between about 0.25 to about 0.35 of the lower photo resist sensitivity, such as, about 0.3 of the lower sensitivity. According to aspects of the invention, a positive-tone photo resist with a relatively higher sensitivity becomes soluble in a predetermined solvent at a lower radiation and/or charged particle dose than a positive-tone photo resist having a relatively lower sensitivity. Accordingly, in the aspect of the invention shown in FIG. 12, the photo resist of layer 64, having a higher (H) sensitivity, will become soluble to the solvent at a lower radiation and/or charged particle dose. In contrast, the photo resist of layer 66, having a lower (L) sensitivity, will not become soluble to the solvent when exposed to a dosage that makes layer 64 soluble. The implications of this difference photo resist sensitivity will become apparent in the following discussion.

FIG. 12 schematically illustrates one aspect of the invention in which any beam 68 is prevented from exposing an area of stack 60. According to this aspect of the invention, the stack 60 includes a surface 70, for example, an exposed or upper surface, and an area 72, for example, a predetermined area (for example, a first area) on surface 70. Area 72 may have an aspect ratio ranging from 1:1, to 10:1, to 100:1 or higher. Area 72 may comprise a circular or polygonal shaped area. Though shown as a simple closed area in FIGS. 12-17, area 72 may be an open area, for example, an open rectangular or open circular area, where area 72 shown is only one part, for example, an axi-symmetric part, of the open area. In the aspect shown in FIGS. 12-17 beam 68, or any other beam, is prevented from illuminating or exposing area 72 on surface 70. Preventing area 72 from being exposed may comprise not directing beam 68 on area 72 or somehow masking, shielding or blocking beam 68 from exposing area 72, for example, by means of a barrier or mask 73. Accordingly, beam 68 or any similar beam does not penetrate surface 70 and does not expose any portions 74, 76 of layers 64, 66, respectively, beneath the area 72. The portion 74 of layer 64 and portion 76 of layer 66 accordingly remain substantially insoluble when contacted with a predetermined solvent. For example, portions 74 and 76, shown shaded in FIGS. 12 and 13, remain cross linked and insoluble in the predetermined solvent.

FIG. 13 schematically illustrates the exposure of the stack 60 to beam 78 (for example, a first beam). According to aspects of the invention, beam 78 illuminates or exposes an area 80, for example, a predetermined area (for example, a second area) on surface 70 of stack 60, contiguous with area 72. Area 80 may have an aspect ratio ranging from 1:1, to 10:1, to 100:1 or higher. Area 80 may also comprise a circular or polygonal shaped area. Though shown as a simple closed area in FIGS. 12-17, area 80 may be an open area, for example, an open rectangular or open circular area, where area 80 shown is only one part, for example, an axi-symmetric part, of the open area. Beam 78 penetrates surface 70 in area 80 and exposes at least a portion 82 of layer 64, that is, the layer having a higher (H) photo resist sensitivity, beneath the area 80 whereby portion 82 becomes substantially soluble when contacted with the predetermined solvent. For example, beam 78 is of sufficient strength or dosage that the polymers in higher (H) sensitivity layer 64, shown shaded in FIGS. 12 and 13, are scissioned and become soluble in the predetermined solvent, but beam 78 is not of sufficient dosage to scission the polymers in lower (L) sensitivity layer 66, the portion 84 of which remains insoluble in the predetermined solvent. The resulting treated stack 60 is shown in FIGS. 14 and 15 with the appropriately shaded portions 74, 76, and 84 which, according to this aspect of the invention, remain insoluble in the predetermined solvent.

FIGS. 15 and 16 schematically illustrate the exposure of the stack 60 to beams 88 and 90 (for example, second beams). According to aspects of the invention, beams 88 and 90 illuminate or expose areas 92 and 94, respectively, for example, predetermined areas (for example, third areas) on surface 70 of stack 60, contiguous with areas 72 and 80. Areas 92 and 94 may comprise circular or polygonal shaped areas. Though shown as a simple closed area in FIGS. 12-17, areas 92 and 94 may be an open area, for example, an open rectangular or open circular area, where areas 92 and 94 shown is only one part, for example, an axi-symmetric part, of the open area. Beams 88 and 90 penetrate surface 70 in areas 92 and 94, respectively, and expose at least a portion of both layer 64, that is, the layer having a higher (H) photo resist sensitivity, beneath the areas 92 and 94, and layer 66, that is, the layer having a lower (L) photo resist sensitivity, whereby both layers 64 and 66 beneath areas 92 and 94 become substantially soluble when contacted with the predetermined solvent. For example, beams 88 and 90 are of sufficient strength or dosage that the polymers in both layers 64 and 66, shown unshaded in FIG. 16, are scissioned and become soluble in the predetermined solvent. The resulting treated stack 60 is shown in FIG. 16 with the appropriately shaded portions 74, 76, and 84 which, according to this aspect of the invention, remain insoluble in the predetermined solvent.

FIG. 17 schematically illustrates the development of stack 60, that is, the contacting of stack 60 with a solvent, indicated by arrow 96, such as, an alcohol or acetone, to dissolve or remove portions of photo resist layers not scissioned by beams 68, 78, 88, or 90. Accordingly, the resulting structure 98 is provided comprising the treated portions 74, 76, and 84. Again, as noted previously, structure 98 may comprise one of many similar structures that may be provided on a single substrate 62 according to aspects of the invention, and FIG. 17 only represents a cross section of structure having a depth that may extend across substrate 62, for example, into the page of FIGS. 12-17.

According to aspects of the invention, in the methods described with respected to FIGS. 6-17 the invention may also include the introduction of layers of material or interface material between the layers of photo resist, for example, between any two layers or between all the mating layers in the photo resist stack. For example, in one aspect, an adhesive layer may be introduced that promotes adhesion between two mating photo resist layers and/or uniform coating, for instance, hexamethyldisilizane (HMDS), a silane, or a siloxane coating, or their equivalent. In another aspect, in order to maintain the delineation or interface between layers, a protective or buffering layer may be provided between layers, for example, a metallic film, for example, to prevent mixing between layers. In another aspect of the invention, the interface between mating photo resist layers may be maintained by using photo resists of different chemistries, for example, photo resists that are associated with different solvents, for instance, mutually exclusive solvent systems. In one aspect of the invention, a single solvent or developer may be used; however, in other aspects, different solvents or developers may be used for different photo resists. It is to be understood that if different solvents or developers are used that they should be compatible with the other solvents or developers, be compatible with the desired process, and do not present safety concerns.

Figure 18:
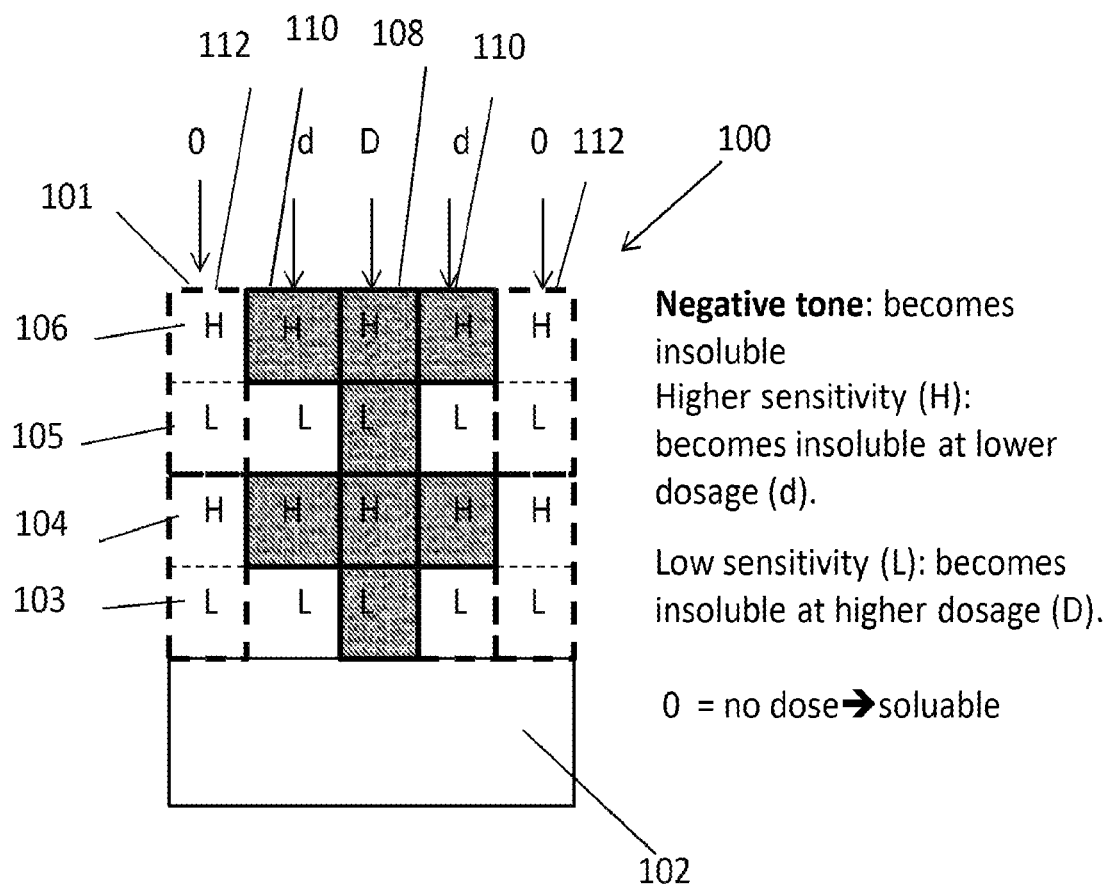
FIG. 18 is a schematic illustration of the treatment of a negative tone photo resist stack according to another aspect of the invention.

FIG. 18 is a schematic illustration of the treatment of a negative-tone photo resist stack 100 deposited on substrate 102 according to another aspect of the invention. As shown in FIG. 18, stack 100 includes a plurality of layers of negative-tone photo resist 103, 104, 105, and 106, for example, deposited by spin coating, and a surface 101. According to aspects of the invention, the layers in stack 100 are of varying sensitivity, for example, layers 103 and 105 comprise relatively lower (L) negative-tone photo resist sensitivity, for example, hydrogen silsesquioxane (HSQ), and layers 104 and 106 comprise relatively higher (H) negative-tone photo resist sensitivity, for example, polyvinyl phenol, such as, the photo resist NEB-31 provided by Sumika Electronic Materials, or its equivalent. The sensitivity of layers 103-106 may also be modified by varying the chemistry, beam voltage, substrate type, or thickness of the layers.

According to aspects of the invention, areas on surface 101 may be exposed, for example, simultaneously exposed, to a varying dosage of electromagnetic radiation or charged particles whereby a desired three-dimensional structure is produced. As shown in FIG. 18, area 108 of surface 101 may be exposed to a beam of relatively higher dosage "D" which penetrates surface 101 whereby a portion of each of the layers 103-106 beneath area 108 are sufficiently exposed whereby they become insoluble in the predetermined solvent. Also, one or more areas 110 of surface 101, contiguous with area 108, may be exposed to a beam of relatively lower dosage "d" which penetrates surface 101 whereby only a portion of the layers 104 and 106, of higher (H) sensitivity, beneath areas 110 are sufficiently exposed whereby they become insoluble in the predetermined solvent, while portions of the layers 103 and 105, of lower (L) sensitivity, beneath areas 110 are insufficiently exposed whereby they remain soluble in the predetermined solvent. Finally, one or more areas 112, contiguous with areas 110, of surface 101 may be exposed to no beam, that is, "0 beam," whereby none of the portion of the layers 103-106 beneath areas 112 are exposed and remain soluble in the predetermined solvent. Areas 108, 110, and 112 may comprise a circular or polygonal shaped areas. Though shown as a simple closed area in FIG. 18, areas 108, 110, and 112 may be open areas, for example, an open rectangular or open circular area, where areas 108, 110, and 112 shown are only one part, for example, an axi-symmetric part, of the open areas.

Upon exposure to an appropriate solvent, only the insoluble portions shown shaded in FIG. 18 will remain after development and provide the desired structure. Again, as noted previously, the shaded structure shown in FIG. 18 may comprise one of many similar structures that may be provided on a single substrate 102 according to aspects of the invention, and FIG. 18 only represents a cross section of structure having a depth that may extend across substrate 102, for example, into the page of FIG. 18.

Figure 19:
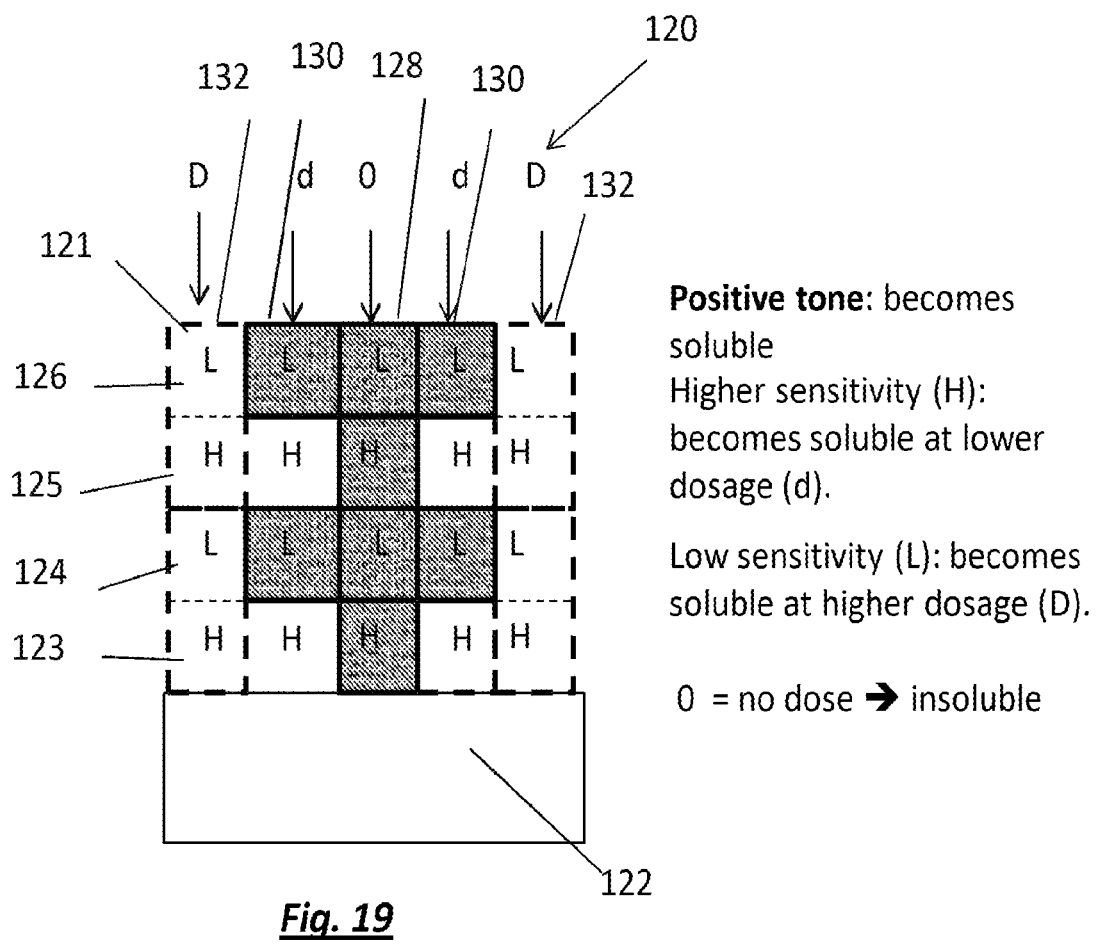
FIG. 19 is a schematic illustration of the treatment of a positive tone photo resist stack according to another aspect of the invention.

FIG. 19 is a schematic illustration of the treatment of a positive-tone photo resist stack 120 deposited on substrate 122 according to another aspect of the invention. As shown in FIG. 19, stack 120 includes a plurality of layers of positive-tone photo resist 123, 124, 125, and 126, for example, deposited by spin coating, and a surface 121. According to aspects of the invention the layers in stack 120 are of varying sensitivity, for example, layers 123 and 125 comprise relatively higher (H) positive-tone photo resist sensitivity, for example, methyl methacrylate-methacrylic acid (MA-MAA) copolymer, or its equivalent, and layers 124 and 126 comprise relatively lower (L) positive-tone photo resist sensitivity, for example, poly(methyl methacrylate) (PMMA), or its equivalent.

According to aspects, of the invention, areas on surface 121 in FIG. 19 may be exposed, for example, simultaneously exposed, to a varying dosage of electromagnetic radiation or charged particles whereby a desired three-dimensional structure is produced. As shown in FIG. 19, area 128 of surface 121 may be exposed to no beam ("0") whereby a portion of each of the layers of positive-tone photo resist 123-126 beneath area 128, regardless of sensitivity, are not exposed and remain insoluble in the predetermined solvent. Also, one or more areas 130 of surface 121, contiguous with area 128, may be exposed to a beam of relatively lower dosage "d" which penetrates surface 121 whereby only a portion of the layers 123 and 125, of higher (H) sensitivity, beneath areas 130 are sufficiently exposed whereby they become soluble in the predetermined solvent, while portions of the layers 124 and 126, of lower (L) sensitivity, beneath areas 130 are insufficiently exposed whereby they remain insoluble in the predetermined solvent. Finally, one or more areas 132, contiguous with areas 130, of surface 121 may be exposed to a beam of relatively higher dosage "D" which penetrates surface 121 whereby a portion of each of the layers 123-126 beneath areas 132 are sufficiently exposed whereby they become soluble in the predetermined solvent. Upon exposure to an appropriate solvent, only the insoluble portions shown shaded in FIG. 19 will remain after development and provide the desired structure. Again, as noted previously, the shaded structure shown in FIG. 19 may comprise one of many similar structures that may be provided on a single substrate 132 according to aspects of the invention, and FIG. 19 only represents a cross section of structure having a depth that may extend across substrate 132, for example, into the page of FIG. 19. Areas 128, 130, and 132 may comprise a circular or polygonal shaped areas. Though shown as a simple closed area in FIG. 19, areas 128, 130, and 132 may be open areas, for example, an open rectangular or open circular areas, where areas 128, 130, and 132 shown are only one part, for example, an axi-symmetric part, of the open areas.

Figure 20:
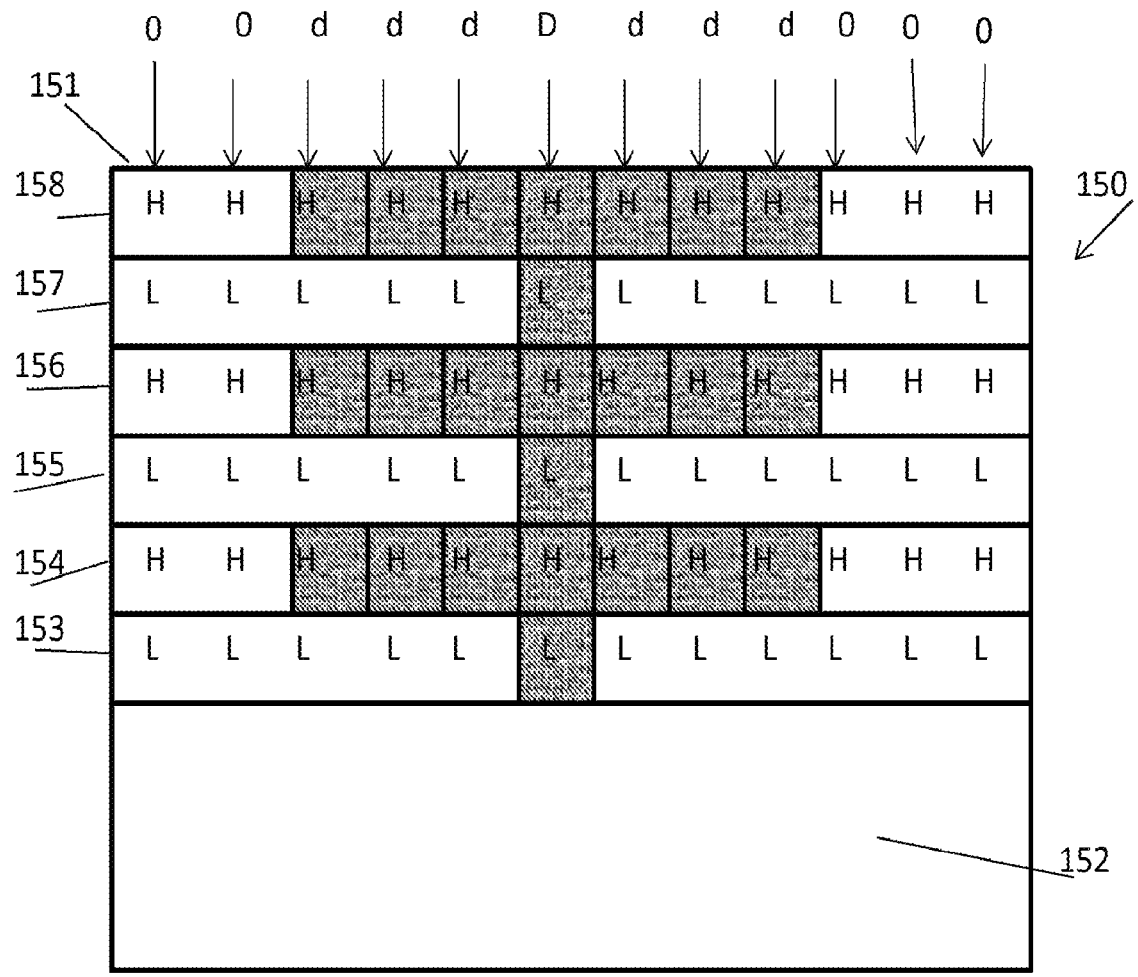
FIG. 20 is a schematic illustration of the treatment of an another negative tone photo resist stack according to an aspect of the invention

FIG. 20 is a schematic illustration of the treatment of another negative-tone photo resist stack 150 deposited on a substrate 152 according to an aspect of the invention. As shown in FIG. 20, stack 150 includes a plurality of layers of negative-tone photo resist 153, 154, 155, 156, 157, and 158, for example, deposited by spin coating, and a surface 151. According to aspects of the invention the layers in stack 150 are of varying sensitivity, for example, layers 153, 155, and 157 comprise relatively lower (L) negative-tone photo resist sensitivity, for example, HSQ, and layers 154, 156, and 158 comprise relatively higher (H) negative-tone photo resist sensitivity, for example, NEB-31.

According to aspects of the invention, areas on surface 151 may be exposed, for example, simultaneously exposed, to a varying dosage of electromagnetic radiation or charged particles whereby a desired three-dimensional structure is produced. As shown in FIG. 20, one or more areas of surface 151 may be exposed to a beam of relatively higher dosage "D" which penetrates surface 151 and whereby a portion of each of the layers 153-158 beneath are sufficiently exposed whereby they become insoluble in the predetermined solvent. Also, one or more areas of surface 151 may be exposed to a beam of relatively lower dosage "d" which penetrates surface 151 whereby only a portion of the layers 154, 156, and 158, of higher (H) sensitivity, beneath are sufficiently exposed whereby they become insoluble in the predetermined solvent, while portions of the layers 153, 155, and 157, of lower (L) sensitivity, are insufficiently exposed whereby they remain soluble in the predetermined solvent. Finally, one or more areas of surface 151 may be exposed to no beam, that is, "0," whereby none of the portions of the layers 153-158 are exposed and these unexposed layers remain soluble in the predetermined solvent.

Upon development with an appropriate solvent, only the insoluble portions shown shaded in FIG. 20 will remain after development and provide the desired structure. Again, the shaded structure shown in FIG. 20 may comprise one of many similar structures that may be provided on a single substrate 152 according to aspects of the invention, and FIG. 20 only represents a cross section of structure having a depth that may extend across substrate 132, for example, into the page of FIG. 20. A structure similar to that shown in FIG. 20 may also be provided by appropriate exposure of a positive-tone photo resists.

Figure 21:
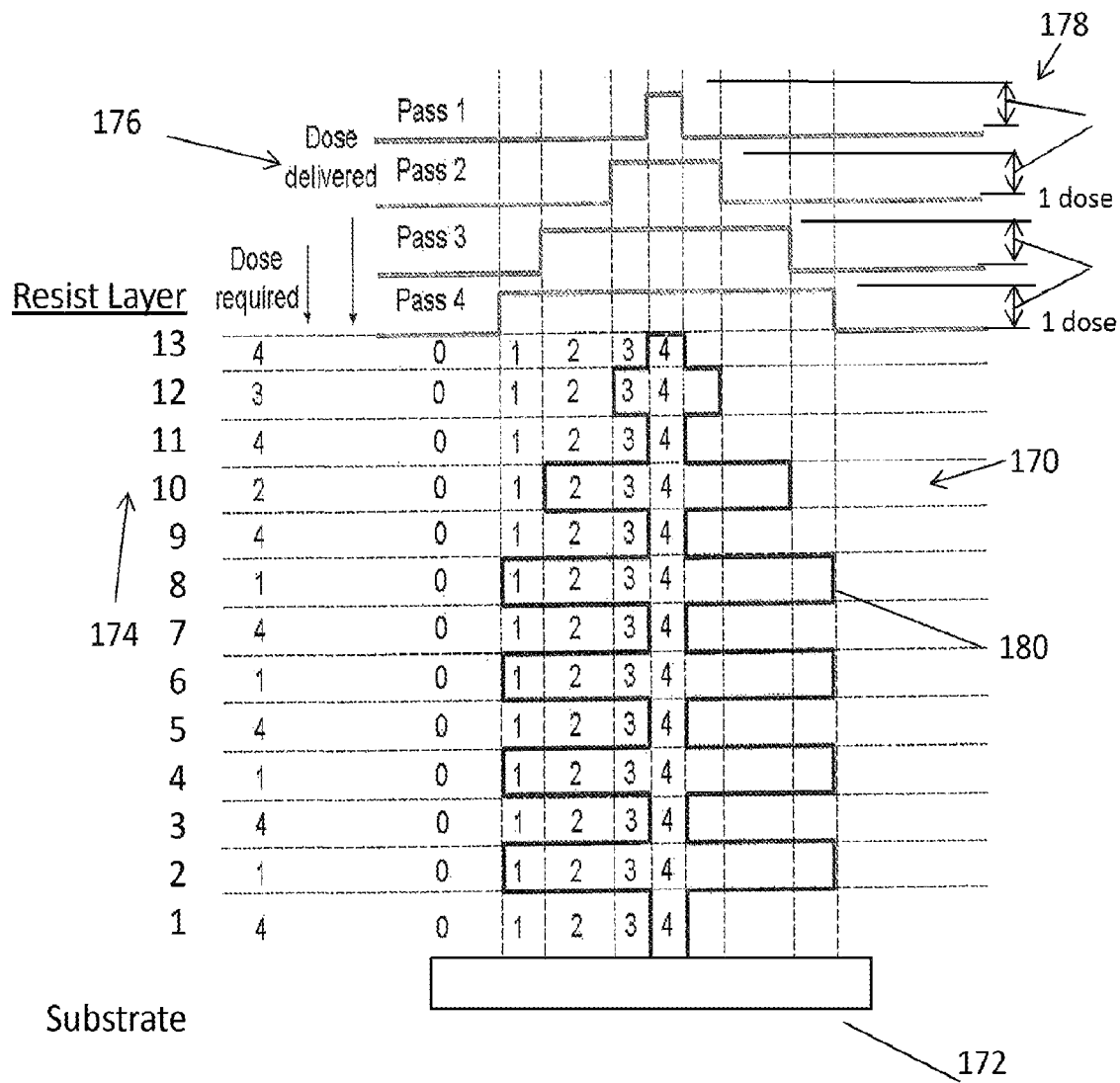
FIG. 21 is a schematic illustration of the treatment of another negative tone photo resist stack according to an aspect of the invention.

FIG. 21 is a schematic illustration of the treatment of another negative-tone photo resist stack 170 deposited on a substrate 172 according to an aspect of the invention. FIG. 22 is a table identifying the photo resist and layer thicknesses for the photo resist stack 170 shown in FIG. 21. According to aspects of the invention, the photo resists stack 170 may be deposited on substrate 172 by spin coating photo resists of varying sensitivities, in this case 4 different sensitivities, and thickness, in this case two different thicknesses. According to aspects of the invention, the larger the number of resist layers, the more beam dose must be provided to sufficiently expose the resist. The thickness of each layer of resist may be controlled and or regulated by the deposition process, for example, the spin coating process, though other deposit processes may be used, including vapor deposition, sputtering, E-beam deposition, atomic layer deposition, and electroplating, among others. According to aspects of the invention, the spacing or pitch between structures may be uniform or non-uniform and may be controlled by the pattern layout in the lithographic process.

FIGS. 21 and 22 include listings 174 of the number corresponding to each of the 13 photo resist layers deposited on substrate 172 shown in FIG. 21. FIG. 21 also identifies a representative "Dosage delivered" 176 to stack 170, for example, in a series of exposures or "passes" 178 illuminating varying areas on the surface of the stack 170. According to this aspect, the "dosages" are normalized energy levels, for example, a dosage of "1" may correspond to about 100 $\mu C/cm^2$, while a dosage of "4" may correspond to 400 $\mu C/cm^2$. FIG. 22 identifies a typical photo resist that may be used for each layer and a typical thickness of each layer in stack 170, while FIG. 21 identifies the relatively sensitivity of each photo resist layer by the "Dosage required" to cross-link the respective photo resist. The "Dosage required" is typically a function of the type of photo resist and the thickness of the photo resist. The specific photo resists that appear in the table in FIG. 22 include hydrogen silsesquioxane (HSQ) and polyvinyl phenol, such as, the photo resist NEB-31 provided by Sumika Electronic materials, though other negative-tone (or positive-tone) photo resists may be used.

As shown in FIG. 21, each layer of the stack 170 requires a "dose" of electromagnetic radiation or charged particles provided, for example, by a 100 kilovolt [kV] electron beam or a 200 kV electron beam, in order to cross link the polymer molecules in the photo resist whereby the photo resist becomes insoluble in an appropriate solvent. For example, as shown in FIG. 21, photo resist layer 8 (from FIG. 22, a 60 nanometer [nm] thick NEB-31 photo resist) requires only 1 "dose" to be dissoluble in an appropriate solvent, while photo resist layer 9 (from FIG. 22, a 160 nm thick HSQ photo resist) requires 4 "doses" to be dissoluble in an appropriate solvent. Accordingly, with specific references to the dosage delivered 176 shown in FIG. 21, layer 8 will be made dissolvable with at least a dosage of 1, which, as shown in FIG. 21, is provided by each of the "passes" 1-4, but to limited areas of the surface of stack 170. Therefore, all portions of layer 8 exposed to a dosage of at least 1 will be insoluble. Should a portion of a layer receive a larger dose than desired, the solubility of the portion is unaffected: once the threshold sensitivity is reached, the solubility of the portion is varied. In contrast, for layer 9, only the middle portion of layer 9 is exposed to the required 4 dosages whereby only the middle portion of layer 9 will be insoluble. According to aspects of the invention, the difference in threshold dose to vary the solubility of a photo resist may be sufficiently different so that the solubility, for example, insolubility, of portions of layers that are not desired are not affected by the dose applied, for example, the lower dose applied. In one aspect, the difference in sensitivity may be at least about 300 $\mu C/cm^2$, for example, at least about 400 $\mu C/cm^2$ or at least about 500 $\mu C/cm^2$. In one aspect, the higher sensitivity, in $\mu C/cm^2$, may be a sensitivity of about 0.10 to about 0.5 of the lower photo resist sensitivity, in $\mu C/cm^2$, for example, between about 0.25 to about 0.35 of the lower photo resist sensitivity, such as, about 0.3 of the lower sensitivity.

Similar treatments to the other layers shown in FIG. 21 yield an insoluble "tree-shaped" structure 179 mounted on substrate 172. Again, as noted previously, the structure 179 shown in FIG. 21 may comprise one of many similar structures that may be provided on a single substrate 172 according to aspects of the invention, and FIG. 21 only represents a cross section of structure having a depth that extends across substrate 172, for example, into the page of FIG. 21.

Similar diagrams and tables as those shown in FIGS. 21 and 22 may be provided for positive-tone photo resists according to aspects of the invention.

As suggested by FIGS. 21 and 22, in one aspect of the invention, the sensitivity of the photo resist layers may be varied in the photo resist stack. For example, in one aspect, the sensitivity of the photo resist layers may be varied as a function of another variable. In one aspect, the plurality of photo resist sensitivities may vary through a depth of the plurality of layers as a function of the position or depth of the layer within the stack. In another aspect, the plurality of layers may have photo resist sensitivities that vary as a function of a beam energy to which each of the plurality of layers is exposed, or expected to be exposed. In one aspect, this variation may be a liner, a quadratic, or a step-wise variation.

Figure 23:
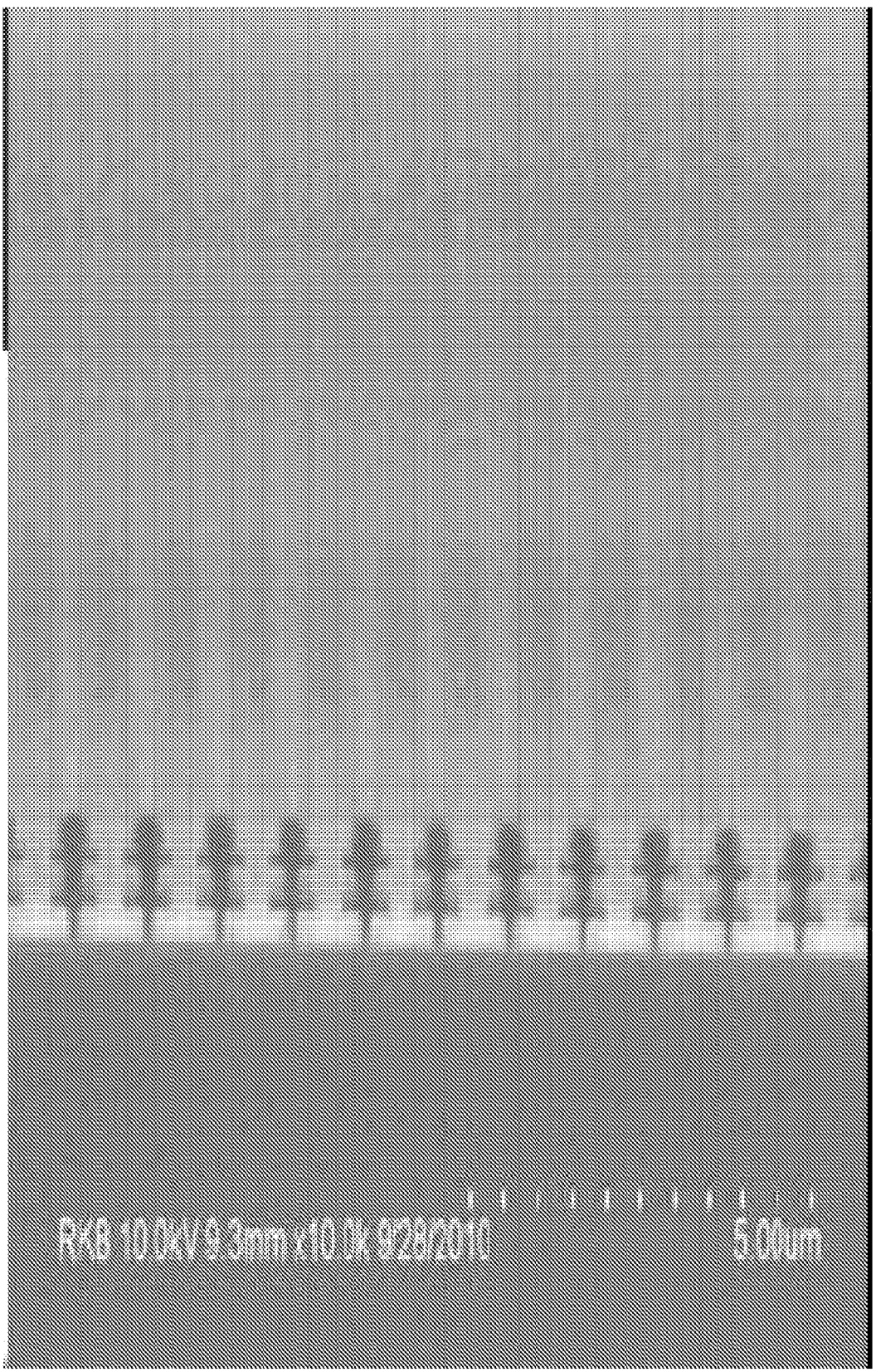
FIGS. 23 through 27 are scanning electron microscope (SEM) images of structures fabricated according to aspects of the invention.
Figure 24:
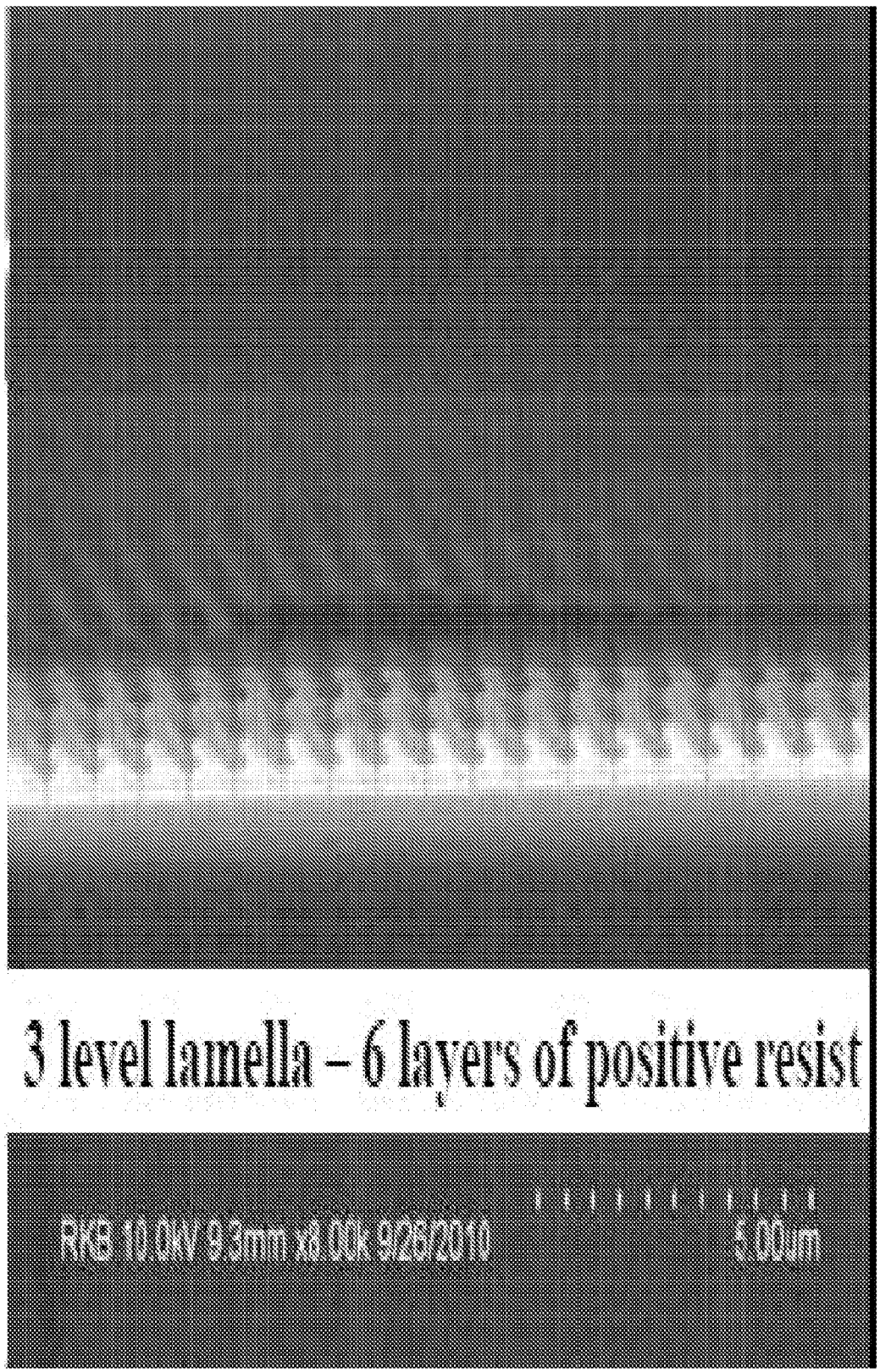
Figure 25:
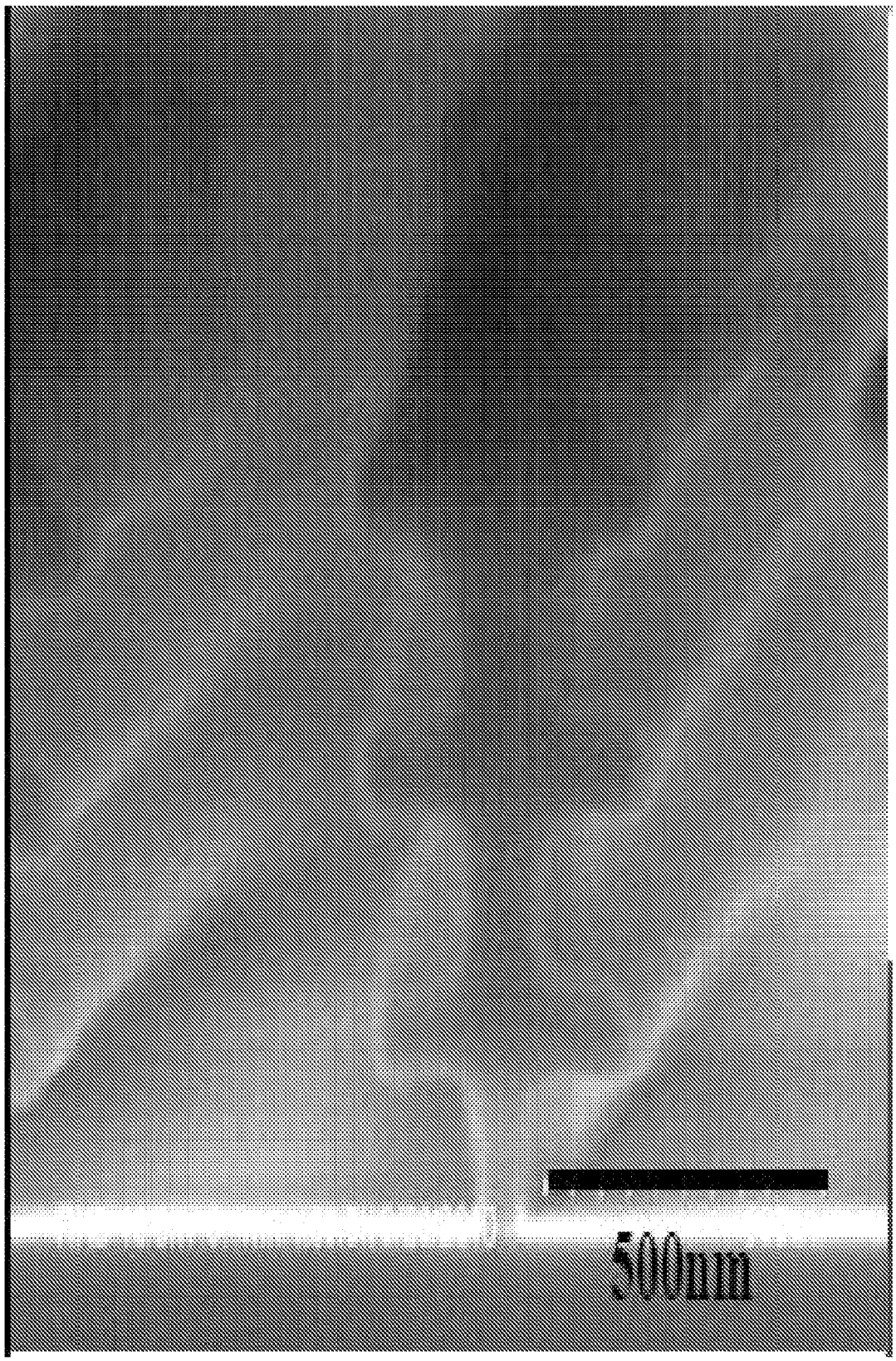
Figure 26:
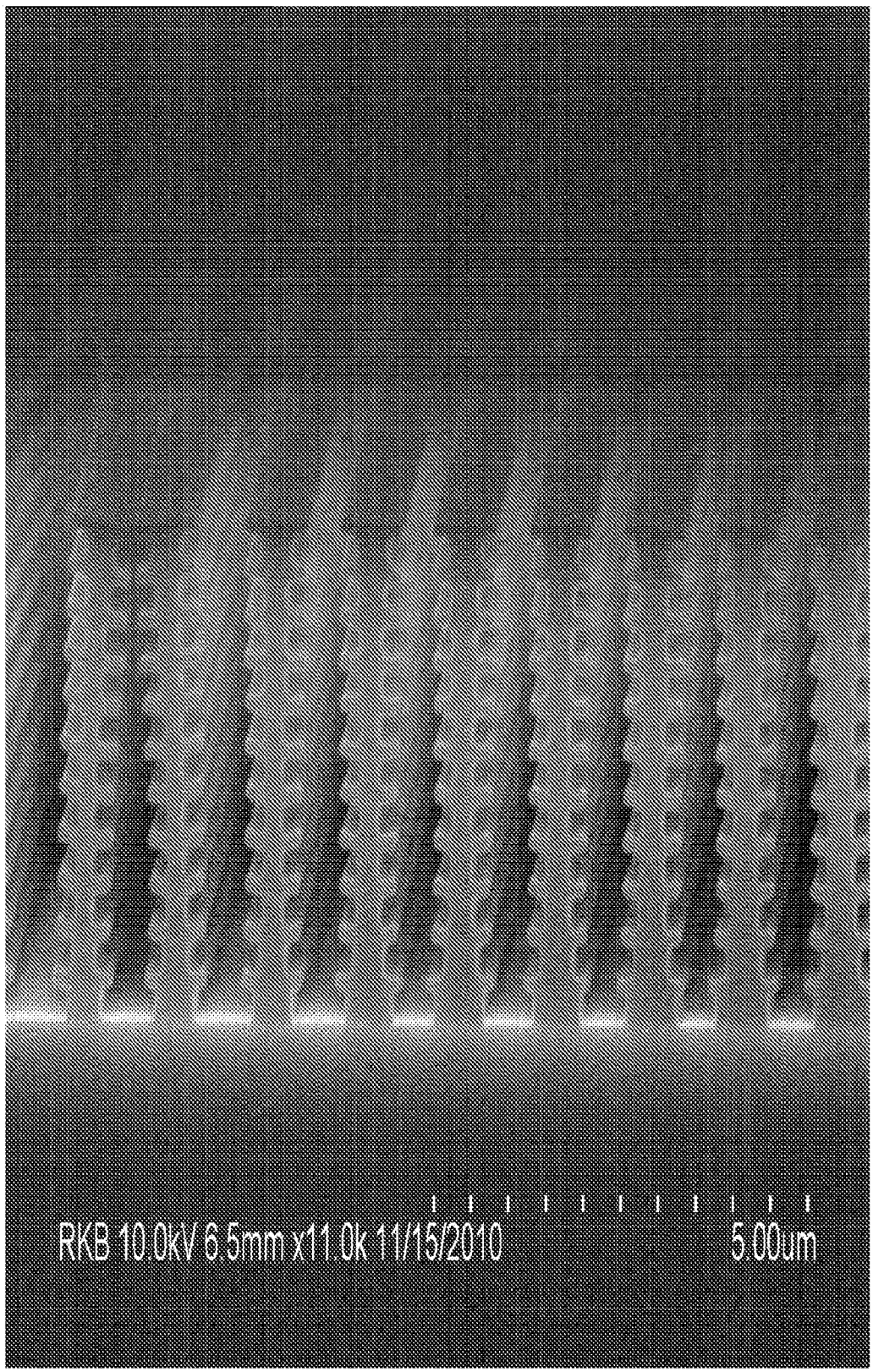
Figure 27:
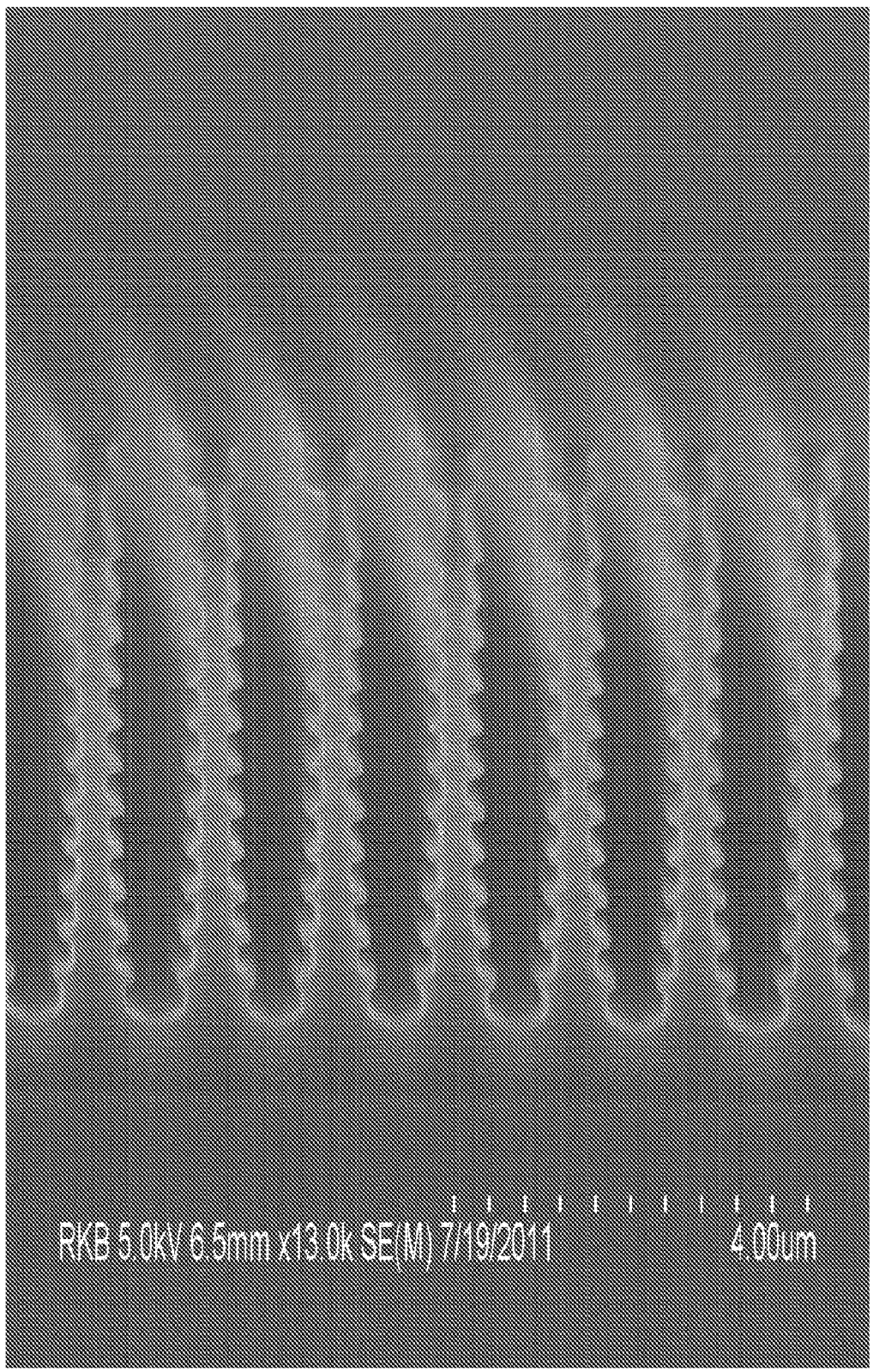

FIGS. 23 through 27 are scanning electron microscope (SEM) images of structures fabricated according to aspects of the invention. FIG. 23 shows a series of "tree-shaped" structures mounted on a substrate where the "branches" of the trees have a width of about 5 micrometers [μm]. FIG. 24 shows a series of "tree-shaped" structures mounted on a substrate and fabricated from 6 layers of photo resist, where 3 of the 6 layers were dissolved from the "trunk" by solvent, thereby leaving "branches" of the trees having a width of about 0.5 µm. FIG. 25 shows a detailed view of one of the "tree" structures shown in FIG. 24. FIG. 26 shows a series of "tree-shaped" structures mounted on a substrate fabricated from 22 layers of photo resist, where 11 of the 22 layers were dissolved from the "trunk" by solvent, thereby leaving "branches" of the trees have a width of about 5 µm. FIG. 27 shows a series of "tree-shaped" structures mounted on a substrate fabricated from 30 layers of photo resist, where 15 of the 30 layers were dissolved from the "trunk" by solvent, thereby leaving "branches" of the trees have a width of about 4 µm.

As shown in FIG. 26, the structural integrity of the structures produced by aspects of the invention may be compromised. For example, as shown in FIG. 26, the "tree" structures may not be sufficiently structurally strong whereby the structures deflect, for example, undesirably deflect, or collapse under their own weight or under the influence of outside forces. According to one aspect of the invention, the structures produced may be re-enforced or structurally strengthened by inserting supports or re-enforcements as needed. Examples of structural re-enforcements that may be provided according to aspects of the invention are shown in FIG. 28.

Figure 28:
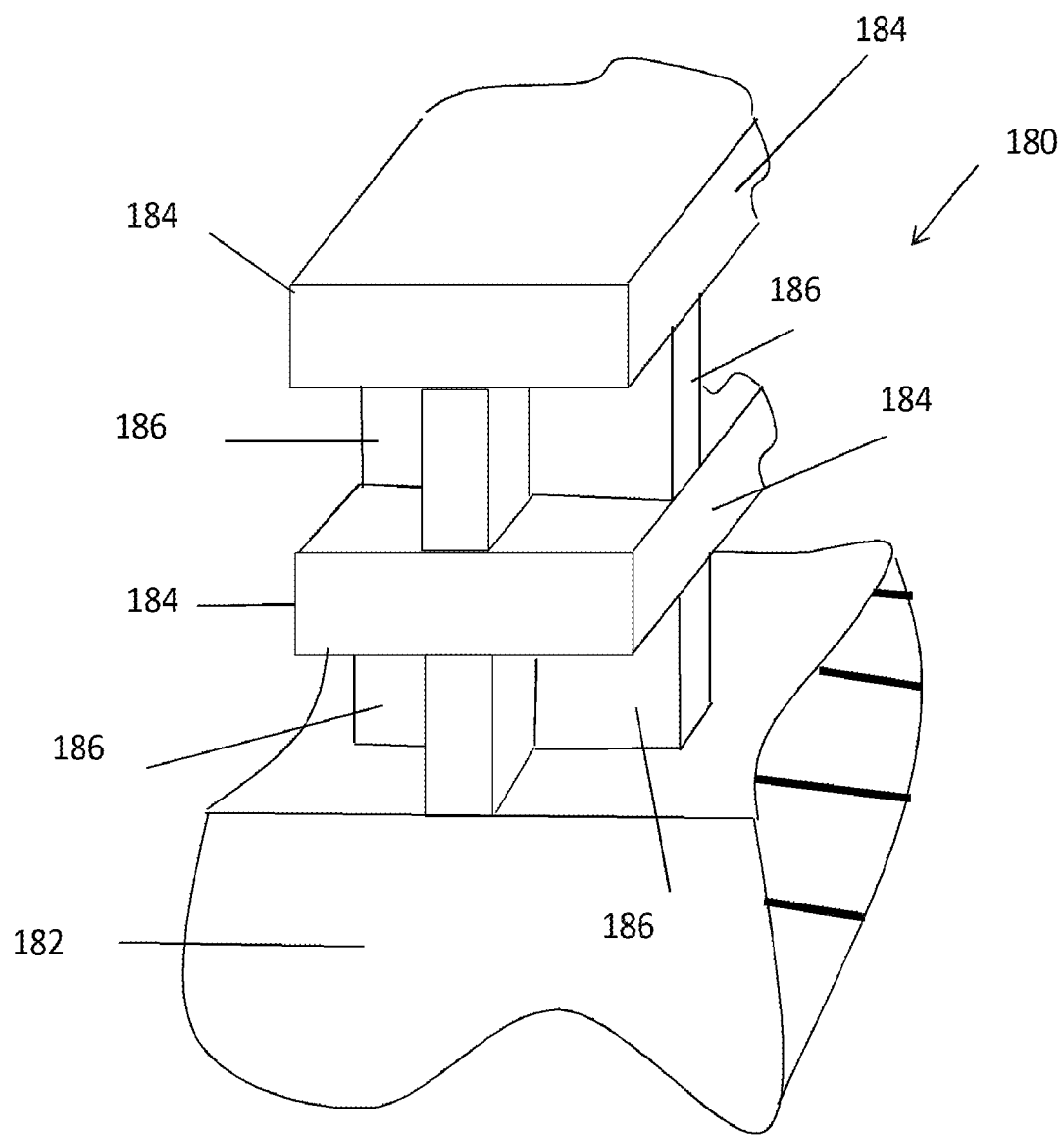
FIG. 28 is a perspective view of another structure mounted on a substrate, shown in a partial, cross-sectional view, according to another aspect of the invention.
Figure 29:
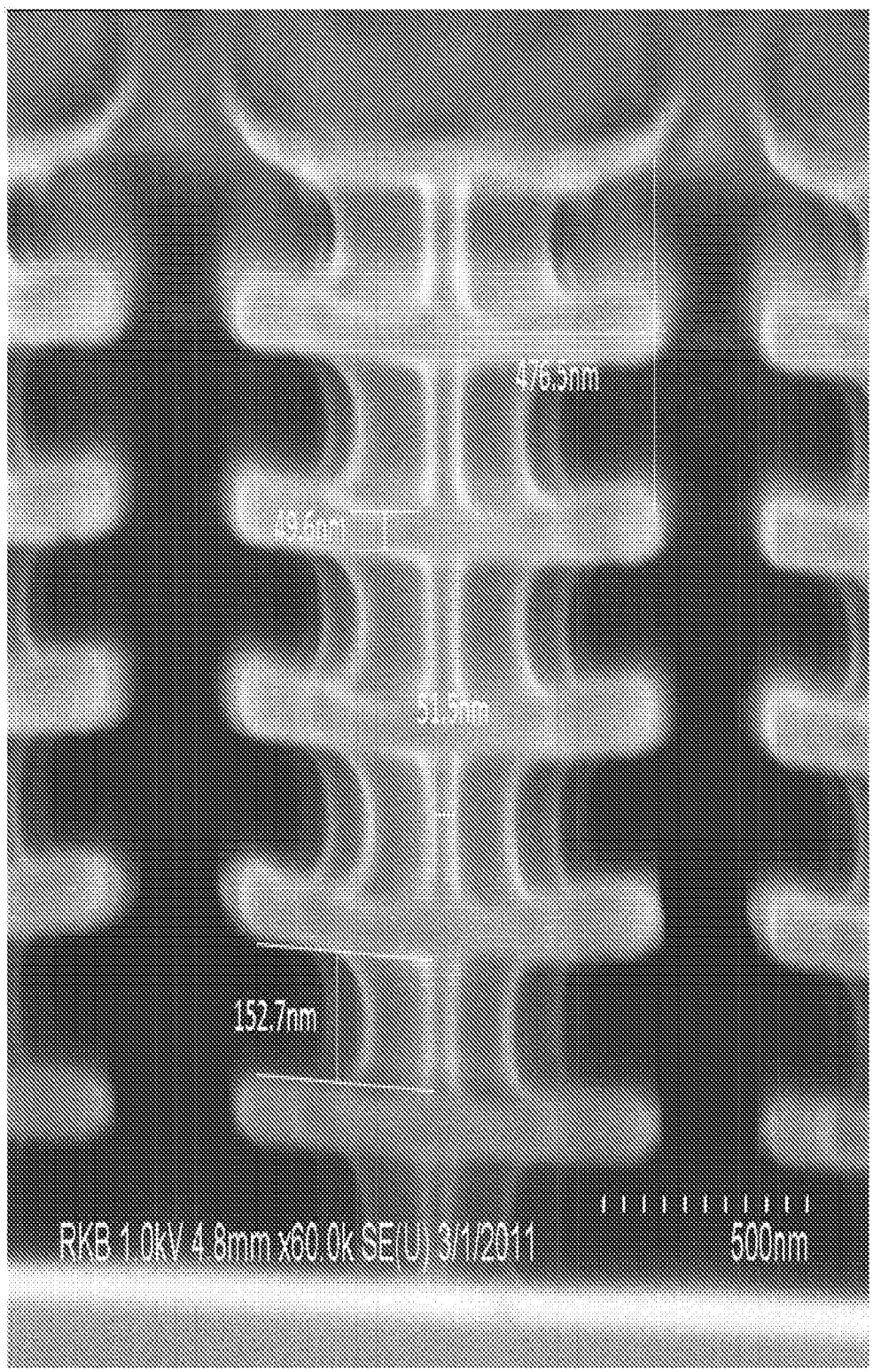
FIG. 29 is a scanning electron microscope (SEM) image of structure having re-enforcing members as shown schematically in FIG. 28 according to an aspect of the invention.

FIG. 28 is a perspective view of structure 180 mounted on a substrate 182, shown in a partial, cross-sectional view, according to another aspect of the invention. As shown, structure 180 includes lateral projections 184, for example, similar to the projections shown in FIGS. 19-21 and 23-26, and reinforcing or buttressing members 186 positioned and sized to reinforce structure 180, for example, to minimize or prevent the deformation shown in FIG. 26. Reinforcing members, or supports, 186 may be fabricated using one or more of the methods disclosed herein, for example, fabricated from a positive-tone or a negative-tone photo resist. FIG. 29 is a scanning electron microscope (SEM) image of structures fabricated according to aspects of the invention having reinforcing or buttressing members, such as, members 186 shown in FIG. 28. The reinforcing or buttressing members may take the form of struts, I-beams, cantilevers, pipes or other support structures.

In addition to structural enhancements that may be provided, for example, as shown in FIGS. 28 and 29, the strength of structures fabricated according to aspects of the invention may be enhanced with addition of reinforcing additives to the photo resist. For example, the photo resist solution may be provided with particles or fibers that function to enhance the structural strength of the structures before, during, or after development. In one aspect, the particles may comprise oxide particles, among other particles and fibers, for example, silicon dioxide ($SiO_2$) particles, titanium dioxide ($TiO_2$) particles and/or aluminum oxide ($Al_2O_3$) particles, among other oxide particles. These particles may comprise nano- or micro-scale particles, such as, "nano particles."

In another aspect of the invention, at least some porosity or cavities may be introduced to the structures fabricated according to aspects of the present invention, for example, to create or enhance gas or vapor absorption by the structures or to enhance the response of a sensor fabricated with structures according to aspects of the invention. For example, a gas may be introduced to the photo resist solution and dispersed within the solution whereby pores or cavities, with or without the gas, are provided before, during, or after development.

Figure 30:
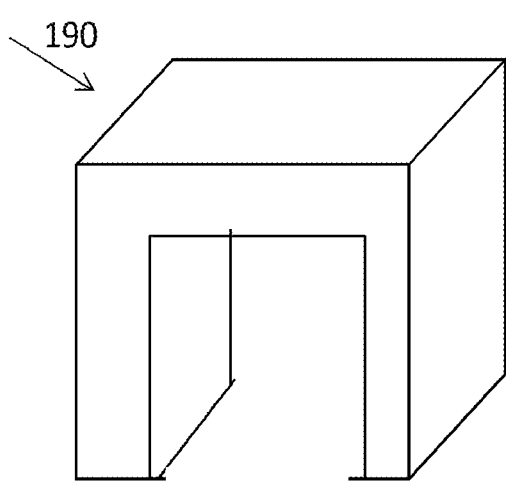
FIGS. 30-33 are perspective views of further structures that may be provided according to aspects of the invention.
Figure 31:
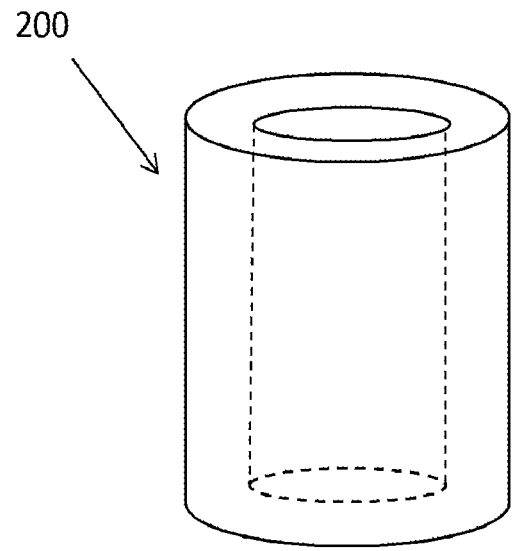
Figure 32:
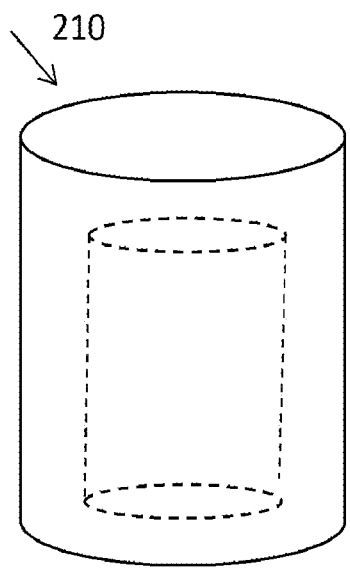
Figure 33:
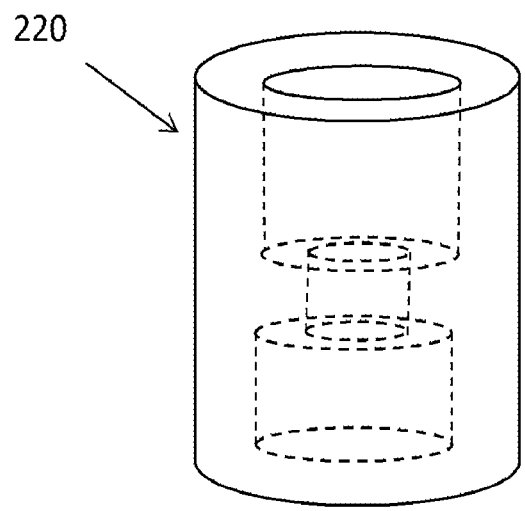

FIGS. 30-33 are perspective views of further structures that may be provided according to aspects of the invention, for example, by varying photo resist selectivity and varying beam dosage. FIG. 30 is a perspective view of "table" structure 190 that may be provided in one aspect of the invention. FIG. 31 is a perspective view of an open "cylinder" structure 200, for example, a right circular cylindrical structure, (though any polygonal cylindrical structures may be provided) that may be provided in one aspect of the invention. FIG. 32 is a perspective view of "rotunda" structure 31, that is, a closed cylindrical having a "roof," that may be provided in one aspect of the invention. FIG. 33 is a perspective view of cylindrical structure 220 with an internal annular structure (though a plurality of annuli may be provided) that may be provided in one aspect of the invention. Further three-dimensional structures that may be provided according to aspects of the invention will be apparent to those of skill in the art. As noted previously, the structures shown in FIGS. 30-33 and any of the structures disclosed herein, may be used as mold cavities or to provide any structure for use in nano-medicine, nano-sensors, nano-electronics, or meta materials, among other fields.

Figure 34:
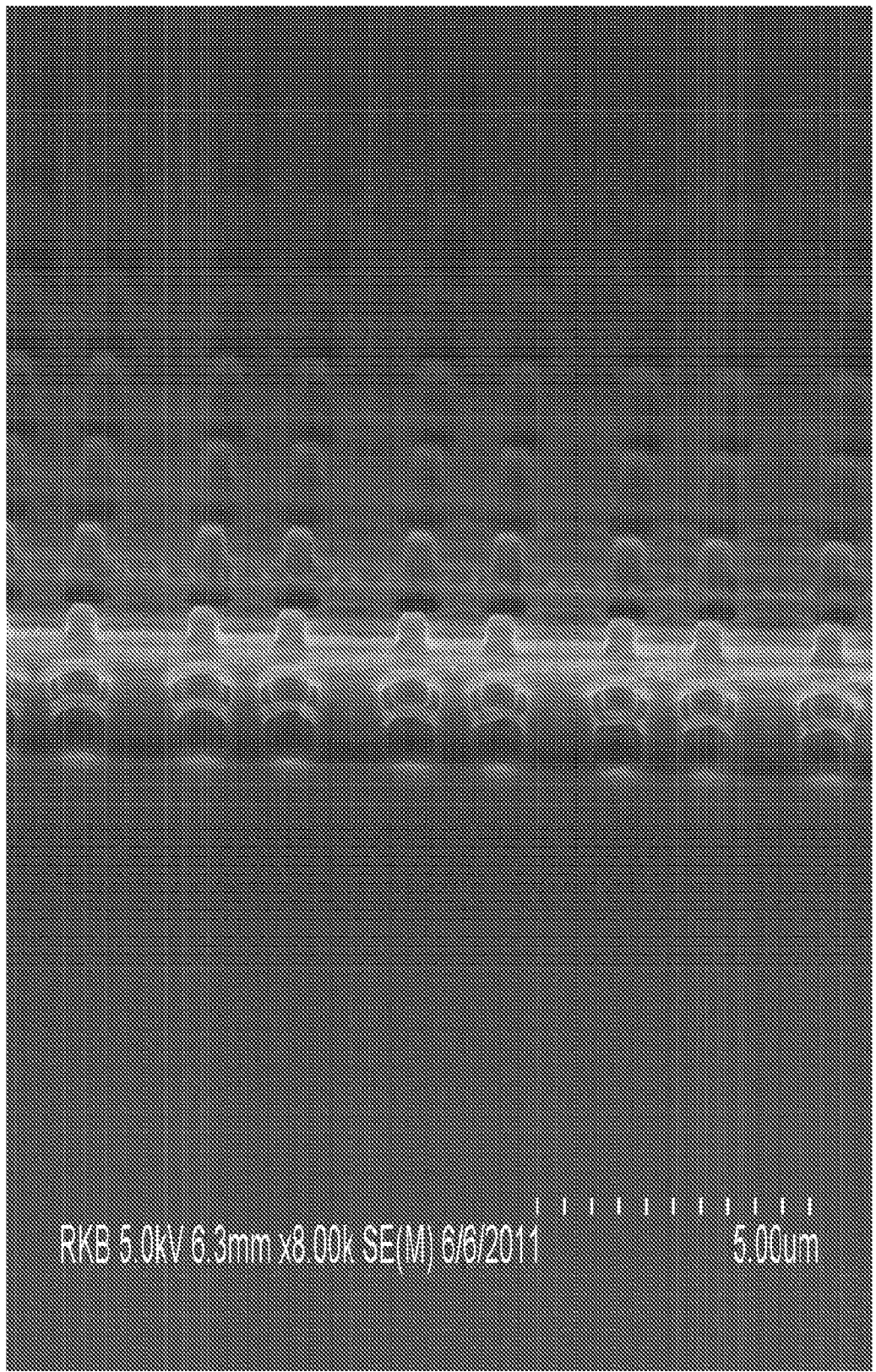
FIGS. 34 through 38 are scanning electron microscope (SEM) images of further structures fabricated according to aspects of the invention.

FIGS. 34-38 are a scanning electron microscope (SEM) images of further structures fabricated according to aspects of the invention. FIG. 34 is a SEM image of a periodic rod and hole structure, for example, a photonic structure, that can be fabricated according to aspects of the invention. This structure represents an indication of the marked advancement of aspects of the invention over the prior art. Specifically, other researchers attempting to fabricate such a structure required about 6 months to fabricate this structure using prior art methods. Employing aspects of the present invention, the structure shown in FIG. 34 was fabricated in less than a day.

Figure 35:
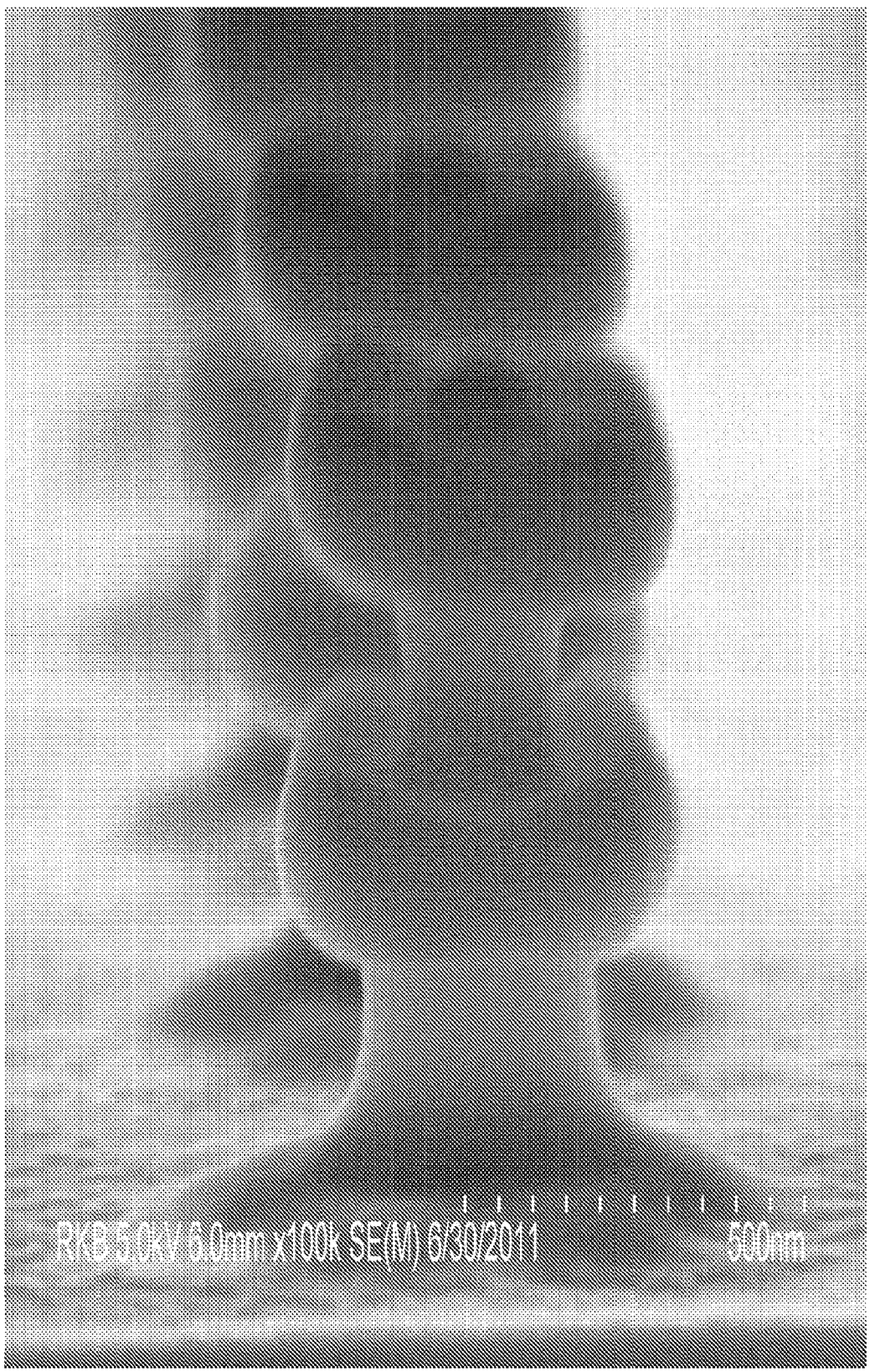
Figure 36:
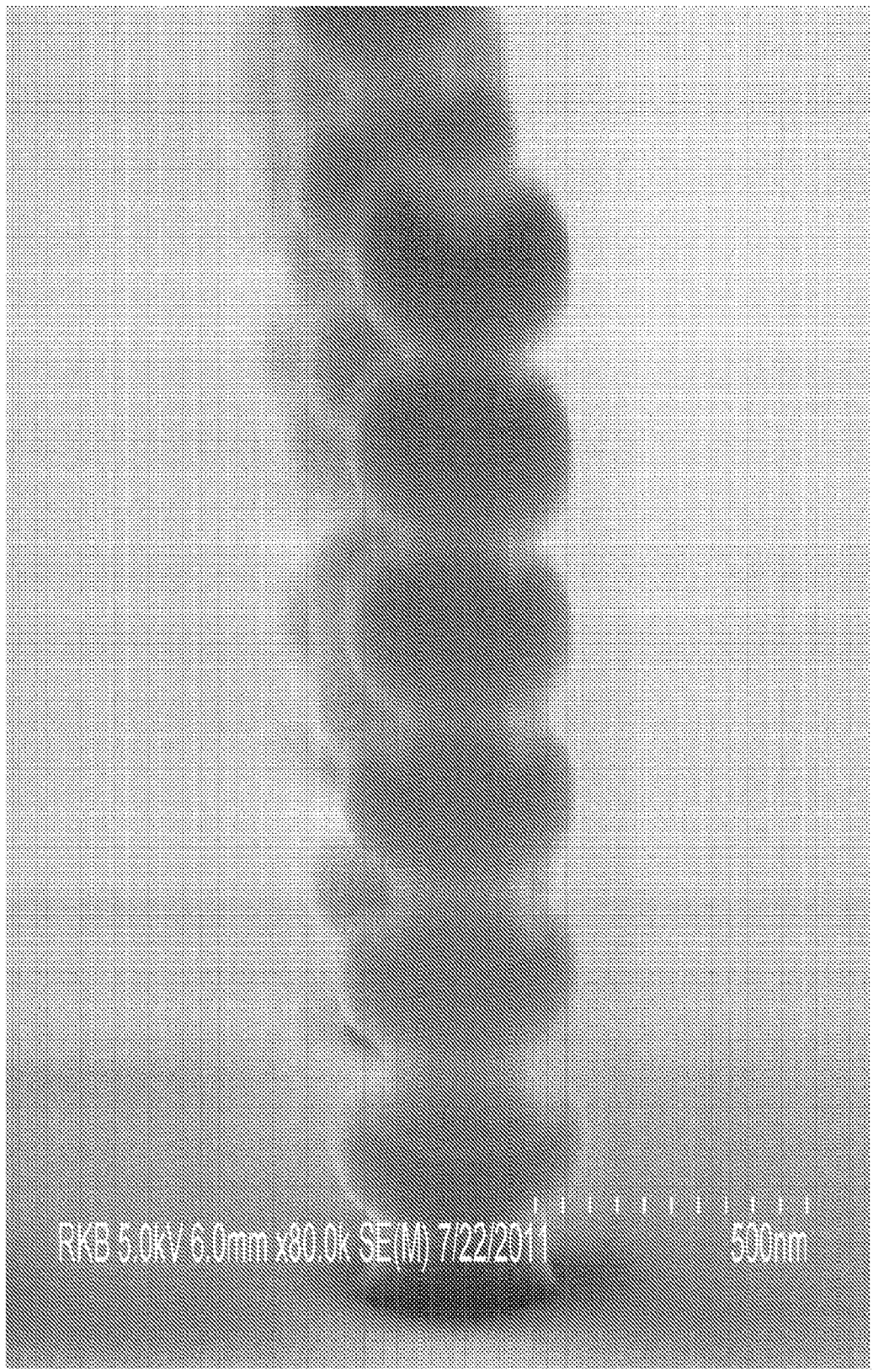
Figure 37:
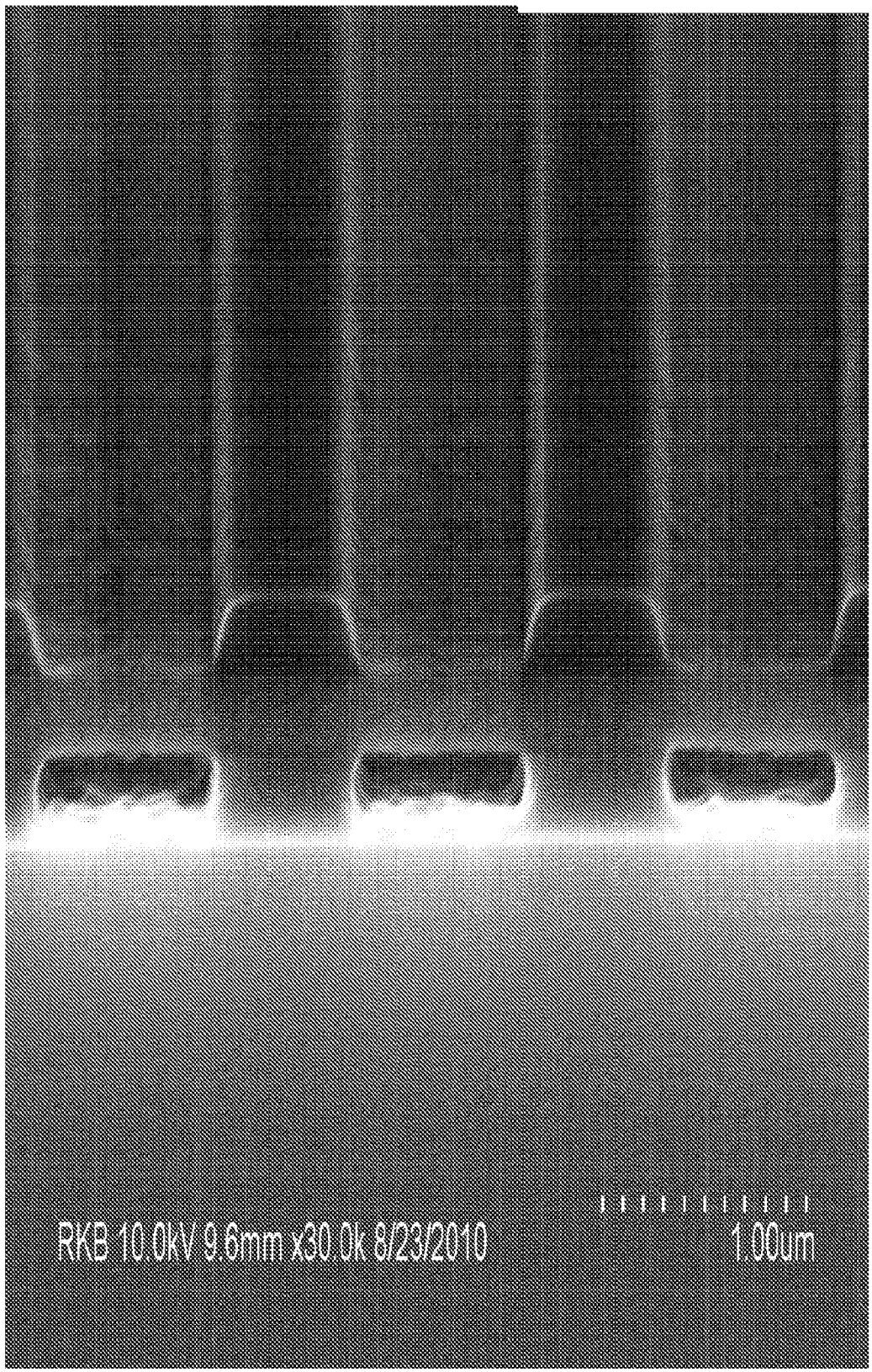
Figure 38:
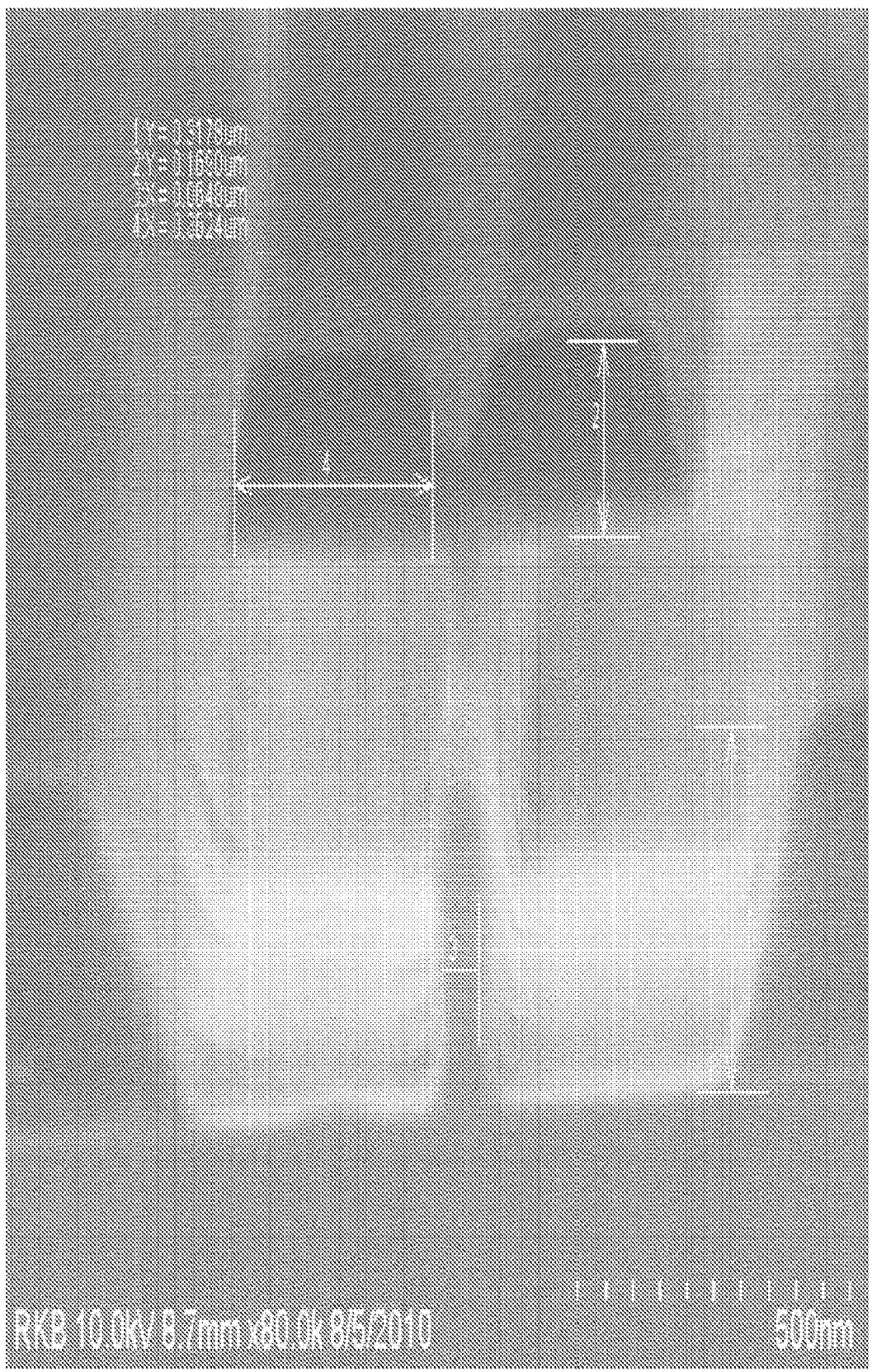

FIG. 35 shows a series of cylindrical structures mounted on a substrate fabricated from 4 layers of photo resist, where 2 of the 4 layers were dissolved from the cylindrical "trunk" by solvent, thereby leaving annular rings having widths of about 1 µm. FIG. 36 shows a series of cylindrical structures mounted on a substrate fabricated from 12 layers of photo resist, where 6 of the 12 layers were dissolved from the cylindrical "trunk" by solvent, thereby leaving annular rings having widths of about 1 µm. FIG. 37 illustrates a microscopic channel structure that may be used for fluid and/or drug delivery, for example, fabricated from a positive or a negative-tone resist, which may be provided according to aspects of the invention. FIG. 38 illustrates an example of a structure fabricated from a combination of resist tones, where the top layer is a negative-tone photo resist (for example, which cross-links upon exposure) and bottom layer is a positive-tone photo resist (for example, which becomes dissolvable upon exposure).

According to aspects of the invention, the height of the structures, for example, the height of the "trees" or "cylinders" above the surface of the substrate, may be 10 µm or more, for instance, 100 µm or more, and comprise 10 or more photo resist layers, for example, 20 or 30 or more, or event 100 or more, photo resist layers. In addition, the horizontal resolution of the structures, for example, the spacing between structures or the length of the "branches" from the "trunk" may be as small as 10 nm or less, for example, 1 nm or less. These dimensions are only limited by the mechanical and chemical properties of the materials, for example, photo resists, and the "strength" of the beam source to penetrate the layers to the desired depths to effect the required photo resist exposure.

As noted above, aspects of the present invention may also be used to fabricate electronic components, for example, resistors, capacitor, and transistors and the like. FIGS. 39-41 are schematic views of a process for fabricating electronic components according to aspects of the invention. FIG. 39 is a schematic illustration of series of layers 230 mounted upon a substrate 232 for fabricating a transistor according to aspects of the invention. Layers 230 may be deposited on substrate 232 by conventional means, for example, by spin coating. As in other aspects of the invention, layers 230 comprise a plurality of radiation or charged particle-sensitive materials, for example, positive-tone or negative-tone photo resists. According to aspects of the invention, by selectively treating the layers 230 in FIG. 39 with an appropriate dose of radiation or charged particles, the properties of the materials in layers 230 can be varied to, for example, produce a transistor, among other electronic components.

In this invention, the intrinsic penetration depth of electromagnetic radiation or charged particles, e.g. an electron beam, is exploited to achieve selective solubility along the height of a resist stack. Solubility is not the only material transformation that can be induced by such irradiation. Other potential transformations include index of refraction, glass transition temperature, electronic properties, polarity, etc. Materials of different dose contrast for transitions between conducting, semiconducting and insulating states open the prospect of intrinsically aligned polymer electronic devices fabricated with a single exposure step. By coalescing multiple process steps into a single exposure, a significant gain in effective throughput is achieved.

In the aspect shown in FIG. 39, layers 230 may comprise a first layer 234 mounted to substrate 232, for example, by conventional means, and may comprise a material that when treated with an appropriate dose can be provided with the proprieties of, for example, a "source" or "drain." For example, the material of layer 234 may be a conducting polymers (polyaniline) or a cryogenic metal-organic precursor, or their equivalent. Second layer 236 mounted to first layer 234, for example, by conventional means, may comprise a material that when treated with an appropriate dose can be provided with the proprieties of, for example, an oxide layer. For example, the material of layer 236 may be a hydrogen silsesquioxane (HSQ), a flowable oxide, or their equivalent. Third layer 238 mounted to second layer 236, for example, by conventional means, may comprise a material that when treated with an appropriate dose can be provided with the properties of, for example, a metal layer. For example, the material of layer 238 may be a conducting polymers (polyaniline) a cryogenic metal-organic precursor, or their equivalent.

FIG. 40 is a schematic illustration of the selective treatment of layers 230 with beams 240 and 242, either sequentially or simultaneously, to produce the desired properties. As shown in FIG. 40, in one aspect, two areas 244 of the surface of layers 230 are treated with beams 240 which pass through layers 238 and 236, for example, without cross-linking or scissioning the polymer chains in layers 236 and 238, and then reacting with a portion of layer 234 to produce the desired material properties, for example, by cross-linking polymers in layer 234. At the same time, before, or after treatment with beam 240, beam 242 is used to illuminate area 245 and expose portions of at least one of layer 236 and 238 to provide the desired properties, for example, cross-linking the polymers in layer 236 and/or 238.

FIG. 41 is a schematic illustration of the resulting, electronic component 250, for example, a transistor, showing the treated portions of the layers 230 by shaded areas. Aspects of the present invention may also be used to fabricate any electronic component, for example, a plurality of electronic components on a single substrate.

Though aspects of the invention may be implemented using optical photo lithographic methods, such as, UV or EUV lithography, such methods may typically require the need for multiple masks and there positioning, removal, and replacement for each dose applied, typically, repeatedly. In addition, in optical lithographic methods, the optical transparency of the photo resists typically must be sufficient to permit photons to penetrate and reach the desired level of the photo resist in the photo resist stack, while also being absorbed sufficiently to achieve the required exposure of the photo resist. In contrast, charge particle illumination, such as, E-beam exposure, is uniquely suited to provide the desired dosages in the desired locations, for example, without the need for masks.

In one aspect of the invention, misalignment between features on the structures provided may be minimized; for example, in one aspect, the alignment error between features on the structures produced may be substantially zero. According to aspects of the invention the positioning of features on a structure, for example, the relative positioning of a "trunk" or the relative positioning of an end of a "branch" on a "tree structure" may exhibit little or no misalignment with adjacent features. This advantage of aspects of the present invention may be due to the fabrication features, for example, "branch ends" by a common beam that defines the edges of features. For example, in one aspect, since a plurality of layers, for instance, all the layers, may be deposited and processed at one instant, rather than placing one layer over another layer, interlayer mis-alignment may be minimized, for example, interlayer error may be substantially zero. Accordingly, since the position of an edge of a beam is typically well defined, the relative alignment of features fabricated by the beam may be relatively precise, for example, with little or no misalignment.

In addition to providing micro, nano-, and/or sub-nanoscale structures, for example, static structures, aspects of the present invention also comprise electronic structures, and methods of fabricating electronic structures, such as, resistors, capacitors, and transistors, among other passive and active electronic components and systems or circuits of electronic components, or optical components or systems.

Aspects of the present invention provide structures, for example, nano- or micro-scale structures, and methods for producing those structures. As will be appreciated by those skilled in the art, features, characteristics, and/or advantages of the various aspects described herein, may be applied and/or extended to any embodiment (for example, applied and/or extended to any portion thereof).

Although several aspects of the present invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

The invention claimed is:

1. A method for producing structures, the method comprising:
   depositing a plurality of layers of photo resist onto a substrate, the plurality of layers having an upper surface and at least one layer having a higher photo resist sensitivity than a photoresist sensitivity of at least one other layer of the plurality of layers;
   exposing a first area of the upper surface to a first beam of one of electromagnetic radiation and charged particles wherein a portion of each of the plurality of layers beneath the first area of the upper surface becomes substantially insoluble when contacted with a predetermined solvent;
   exposing a second area of the upper surface, contiguous with the first area, to a second beam of one of electromagnetic radiation and charged particles wherein a portion of the at least one layer having a higher photo resist sensitivity beneath the second area becomes substantially insoluble when contacted with the predetermined solvent; and contacting the plurality of layers with the predetermined solvent to dissolve soluble portions to provide the structure.

2. The method recited in claim 1, wherein the plurality of layers of photo resist comprises at least three layers of photo resist.

3. The method recited in claim 2, wherein the at least one layer having the higher photo resist sensitivity comprises at least two layers having the higher photo resist sensitivity.

4. The method recited in claim 1, wherein the method further comprises exposing at least a third area of the upper surface, contiguous with the second area, to a third beam of one of electromagnetic radiation and charged particles capable of making a portion of the at least one layer having a higher photo resist sensitivity beneath the third area substantially insoluble when contacted with the predetermined solvent.

5. The method recited in claim 1, wherein the first area of the upper surface exposed to the first beam and the second area of the upper surface exposed to the second beam each comprise one of a polygonal area and a circular area.

6. The method recited in claim 5, wherein the first area of the upper surface exposed to the first beam and the second area of the upper surface exposed to the second beam each comprise rectangular areas.

7. The method as recited in claim 1, wherein the structure comprises a cavity.

8. The method as recited in claim 7, wherein the cavity comprises a mold cavity.

9. The method recited in claim 1, wherein a power delivered by the first beam is different from a power delivered by the second beam.

10. The method recited in claim 1, wherein the plurality of layers comprise a plurality of photo resist sensitivities.

11. The method as recited in claim 10, wherein each of the plurality of layers comprises a photo resist sensitivity as a function of a beam energy to which each of the plurality of layers is exposed.

12. The method as recited in claim 10, wherein the plurality of photo resist sensitivities vary through a depth of the plurality of layers.

13. The method recited in claim 10, wherein each of the plurality of photo resist sensitivities varies as a function of a depth of each of the plurality of layers.

14. The method as recited in claim 1, wherein exposing the first area of the upper surface and exposing the second area of the upper surface are practiced substantially simultaneously.

15. The method as recited in claim 1, wherein exposing the first area of the upper surface and exposing the second area of the upper surface are practiced sequentially.

16. A method for producing structures, the method comprising:
depositing a plurality of layers of photo resist onto a substrate, the plurality of layers having an upper surface and at least one layer having a higher photo resist sensitivity than a photo resist sensitivity of at least one other layer of the plurality of layers;
preventing exposure of a first area of the upper surface to any beam of electromagnetic or charged particles to ensure that a portion of each of the plurality of layers beneath the first area of the upper surface is substantially insoluble when contacted with a predetermined solvent;
exposing a second area of the upper surface, contiguous with the first area, to a first beam of one of electromagnetic radiation and charged particles wherein a portion of the at least one layer having a higher photo resist sensitivity beneath the second area becomes substantially soluble when contacted with the predetermined solvent;

exposing at least one third area of the upper surface, contiguous with at least one of the first area and the second area, to a second beam of one of electromagnetic radiation and charged particles wherein a portion of each of the plurality of layers beneath the at least one third area becomes substantially soluble when contacted with the predetermined solvent; and contacting the plurality of layers with the predetermined solvent to dissolve the soluble portions to provide the structure.

17. The method recited in claim 16, wherein the plurality of layers of photo resist comprises at least three layers of photo resist.

18. The method recited in claim 17, wherein the at least one layer having the higher photo resist sensitivity comprises at least two layers having the higher photo resist sensitivity.

19. The method recited in claim 16, wherein the first area of the upper surface prevented from being exposed to any beam and the second area of the upper surface exposed to the first beam each comprise one of a polygonal area and a circular area.

20. The method recited in claim 19, wherein the first area of the upper surface prevented from being exposed to any beam and the second area of the upper surface exposed to the first beam each comprise rectangular areas.

21. The method as recited in claim 16, wherein the structure comprises a cavity.

22. The method as recited in claim 21, wherein the cavity comprises a mold cavity.

23. The method recited in claim 16, wherein a power delivered by the first beam is different from a power delivered by the second beam.

24. The method recited in claim 16, wherein the plurality of layers comprises a plurality of photo resist sensitivities.

25. The method as recited in claim 24, wherein each of the plurality of layers comprises a photo resist sensitivity as a function of a beam energy to which each layer is exposed.

26. The method as recited in claim 24, wherein the plurality of photo resist sensitivities vary through a depth of the plurality of layers.

27. The method as recited in claim 24, wherein each of the plurality of photo resist sensitivities varies as a function of a depth of each of the plurality of layers.

28. The method as recited in claim 16, wherein preventing exposure of the first area of the upper surface and exposing the second area of the upper surface are practiced substantially simultaneously.

29. The method as recited in claim 16, wherein exposing of the at least one third area of the upper surface and exposing the second area of the upper surface are practiced substantially simultaneously.

30. The method as recited in claim 16, wherein exposing of the at least one third area of the upper surface and exposing the second area of the upper surface are practiced sequentially.

31. The method as recited in claim 16, wherein preventing exposure of the first area of the upper surface, exposing the second area of the upper surface, and exposing the at least one third area of the upper surface are practiced substantially simultaneously.

32. A method of fabricating a 3 dimensional structure, comprising: forming a stack of at least 2 layers of photo resist material having different photo resist sensitivities upon a substrate; exposing the stack to beams of electromagnetic radiation or charged particles of different dosages to achieve selective solubility along a height of the stack, wherein said exposing comprises at least one of:

(1) when the at least 2 layers of photo resist material have a negative tone, exposing a first area of an upper surface of the stack to a first beam of one of electromagnetic radiation and charged particles wherein a portion of each of the at least 2 layers beneath the first area of the upper surface becomes substantially insoluble when contacted with a predetermined solvent, exposing a second area of the upper surface, contiguous with the first area, to a second beam of one of electromagnetic radiation and charged particles when a portion of at least one layer having a higher photo resist sensitivity beneath the second area becomes substantially insoluble when contacted with the predetermined solvent; and (2) when the at least 2 layers of photo resist material have a positive tone, preventing exposure of a first area of an upper surface of the stack to any beam of electromagnetic or charged particles to ensure that a portion of each of the at least 2 layers beneath the first area of the upper surface is substantially insoluble when contacted with a predetermined solvent, exposing a second area of the upper surface, contiguous with the first area, to a first beam of one of electromagnetic radiation and charged particles wherein a portion of at least one layer having a higher photo resist sensitivity beneath the second area become substantially soluble when contacted with the predetermined solvent, and exposing at least one third area of the upper surface, contiguous with at least one of the first area and the second area, to a second beam of one of electromagnetic radiation and charged particles wherein a portion of each of the at least 2 layers beneath the at least one third area becomes substantially soluble when contacted with the predetermined solvent; and dissolving soluble portions of the stack with the predetermined solvent to produce a 3 dimensional structure of desired geometry.

33. The method as recited in claim 32, further comprising at least one of: adding a reinforcing member to the structure, and adding a reinforcing additive to at least one photo resist material.

34. The method as recited in claim 32, further comprising adding porosity or cavities to the structure.

35. The method as recited in claim 32, further comprising selecting a photo resist material for at least one of said layers having a property, in addition to solubility, affected by exposure to at least one of the first beam and the second beam.

36. The method as recited in claim 35, wherein the property comprises at least one of index of refraction, glass transition temperature, electronic properties and polarity.

37. The method as recited in claim 32, wherein at least one of tone and sensitivity of the photo resist material varies as a function of depth within the stack.

38. The method as recited in claim 32, further comprising at least one of: introducing an adhesive layer, a uniform coating or a buffering layer between two adjoining photo resist layers; employing mutually exclusive solvents for different layers of photo resist material; and employing mutually compatible solvents for different layers of photo resist material.

* * * * *